United States Patent
Far

(10) Patent No.: US 10,915,298 B1
(45) Date of Patent: Feb. 9, 2021

(54) CURRENT MODE MULTIPLY-ACCUMULATE FOR COMPUTE IN MEMORY BINARIZED NEURAL NETWORKS

(71) Applicant: Ali Tasdighi Far, San Jose, CA (US)

(72) Inventor: Ali Tasdighi Far, San Jose, CA (US)

(*) Notice: Subject to any disclaimer, the term of this patent is extended or adjusted under 35 U.S.C. 154(b) by 0 days.

(21) Appl. No.: 16/945,528

(22) Filed: Jul. 31, 2020

Related U.S. Application Data

(63) Continuation-in-part of application No. 16/746,897, filed on Jan. 19, 2020, now Pat. No. 10,862,501.
(Continued)

(51) Int. Cl.
*H03M 1/66* (2006.01)
*G06F 7/544* (2006.01)
(Continued)

(52) U.S. Cl.
CPC .......... *G06F 7/5443* (2013.01); *G06N 3/063* (2013.01); *H03M 1/664* (2013.01); *H03M 1/687* (2013.01)

(58) Field of Classification Search
CPC ...... H03M 1/687; H03M 1/745; H03M 1/747; H03M 1/0604; H03M 1/0602;
(Continued)

(56) References Cited

U.S. PATENT DOCUMENTS

| | | |
|---|---|---|
| 4,677,369 A | 6/1987 | Bowers et al. |
| 4,899,066 A | 2/1990 | Aikawa et al. |

(Continued)

OTHER PUBLICATIONS

Ali Far, "Small size class AB amplifier for energy harvesting with ultra low power, high gain, and high CMRR," 2016 IEEE International Autumn Meeting on Power, Electronics and Computing (ROPEC), Ixtapa, 2016, pp. 1-5.
(Continued)

*Primary Examiner* — Linh V Nguyen

(57) ABSTRACT

Methods of performing mixed-signal current-mode multiply-accumulate (MAC) operations for binarized neural networks in an integrated circuit are described in this disclosure. While digital machine learning circuits are fast, scalable, and programmable, they typically require bleeding-edge deep sub-micron manufacturing, consume high currents, and they reside in the cloud, which can exhibit long latency, and not meet private and safety requirements of some applications. Digital machine learning circuits also tend to be pricy given that machine learning digital chips typically require expensive tooling and wafer fabrication associated with advanced bleeding-edge deep sub-micron semiconductor manufacturing. This disclosure utilizes mixed-signal current mode signal processing for machine learning binarized neural networks (BNN), including Compute-In-Memory (CIM), which can enable on-or-near-device machine learning and or on sensor machine learning chips to operate more privately, more securely, with low power and low latency, asynchronously, and be manufacturable on non-advanced standard sub-micron fabrication (with node portability), that are more mature and rugged with lower costs. An example of enabling features of this disclosure is as follows: to save power in an "always-on' setting, reduce chip costs, process signals asynchronously, and reduce dynamic power consumption. Current mode signal processing is utilized in combination with CIM (to further reduce dynamic power consumption associated with read/write cycles in and out of memory) for bitwise counting of plurality of logic state '1' of plurality of XOR outputs for MAC arithmetic in BNNs.

9 Claims, 9 Drawing Sheets

Related U.S. Application Data

(60) Provisional application No. 62/912,407, filed on Oct. 8, 2019.

(51) Int. Cl.
   *G06N 3/063* (2006.01)
   *H03M 1/68* (2006.01)

(58) Field of Classification Search
   CPC .... H03M 1/0651; H03M 1/682; H03M 1/685; H03M 1/785; H03M 1/68; H03M 1/0695; H03M 1/765; H03M 3/502; H03M 7/3004; H03M 1/0682; H03M 1/1057; H03M 1/1061; H03M 1/145; H03M 1/365; H03M 1/664; H03M 1/76; H03M 1/88
   USPC .............. 341/118–120, 137, 144, 153, 154
   See application file for complete search history.

(56) References Cited

U.S. PATENT DOCUMENTS

| | | |
|---|---|---|
| 5,218,246 A | 6/1993 | Lee et al. |
| 5,261,035 A | 11/1993 | Adler |
| 5,280,564 A | 1/1994 | Shioni et al. |
| 5,283,579 A | 2/1994 | Tasdighi |
| 5,289,055 A | 2/1994 | Razavi |
| 5,294,927 A | 3/1994 | Levinson et al. |
| 5,329,632 A | 7/1994 | Lee et al. |
| 5,334,888 A | 8/1994 | Bodas |
| 5,391,938 A | 2/1995 | Hatsuda |
| 5,523,707 A | 6/1996 | Levy et al. |
| 5,535,309 A | 7/1996 | Shin |
| 5,576,637 A | 11/1996 | Akaogi et al. |
| 5,581,661 A | 12/1996 | Wang |
| 5,583,456 A | 12/1996 | Kimura |
| 5,592,107 A | 1/1997 | McDermott |
| 5,640,084 A | 6/1997 | Tero et al. |
| 5,668,710 A | 9/1997 | Caliboso et al. |
| 5,734,260 A | 3/1998 | Tasdighi et al. |
| 5,734,291 A | 3/1998 | Tasdighi et al. |
| 5,814,995 A | 9/1998 | Tasdighi |
| 5,861,762 A | 1/1999 | Sutherland |
| 5,923,208 A | 7/1999 | Tasdighi et al. |
| 5,966,029 A | 10/1999 | Tarrab et al. |
| 6,005,374 A | 12/1999 | Tasdighi |
| 6,054,823 A | 4/2000 | Collings et al. |
| 6,122,284 A | 9/2000 | Tasdighi et al. |
| 6,166,670 A * | 12/2000 | O'Shaughnessy ...... G05F 3/262 341/136 |
| 6,353,402 B1 * | 3/2002 | Kanamori .............. H03M 1/002 323/315 |
| 6,573,758 B2 | 6/2003 | Boerstler et al. |
| 6,727,728 B1 | 4/2004 | Bitting |
| 6,754,645 B2 | 6/2004 | Shi et al. |
| 6,903,579 B2 | 6/2005 | Rylov |
| 6,930,512 B2 | 8/2005 | Yin |
| 7,088,138 B2 | 8/2006 | Xu et al. |
| 7,142,014 B1 | 11/2006 | Groen et al. |
| 7,298,171 B2 | 11/2007 | Parris |
| 7,557,614 B1 | 7/2009 | Bonsels et al. |
| 7,557,743 B2 * | 7/2009 | Imai ..................... H03M 1/0604 341/117 |
| 7,612,583 B2 | 11/2009 | Winograd |
| 7,924,198 B2 * | 4/2011 | Cui ....................... H03M 1/002 341/144 |
| 8,587,707 B2 * | 11/2013 | Matsumoto ........... H03M 1/745 348/294 |
| 8,653,857 B2 | 2/2014 | Becker |
| 9,519,304 B1 | 12/2016 | Far |
| 9,780,652 B1 | 10/2017 | Far |
| 9,921,600 B1 | 3/2018 | Far |
| 10,009,686 B1 * | 6/2018 | Das ....................... H03M 1/002 |
| 10,177,713 B1 | 1/2019 | Far |
| 10,198,022 B1 | 2/2019 | Far |
| 10,311,342 B1 | 6/2019 | Farhadi et al. |
| 10,387,740 B2 | 8/2019 | Yang et al. |
| 10,411,597 B1 | 9/2019 | Far |
| 10,491,167 B1 | 11/2019 | Far |
| 10,504,022 B2 | 12/2019 | Temam et al. |
| 10,536,117 B1 | 1/2020 | Far |
| 10,560,058 B1 | 2/2020 | Far |
| 10,581,448 B1 | 3/2020 | Far |
| 10,592,208 B2 | 3/2020 | Wang et al. |
| 10,594,334 B1 | 3/2020 | Far |
| 10,664,438 B2 | 3/2020 | Sity et al. |
| 10,621,486 B2 | 4/2020 | Yao |
| 10,684,955 B2 | 6/2020 | Luo et al. |
| 10,691,975 B2 | 6/2020 | Bagherinezhad et al. |
| 10,699,182 B2 | 6/2020 | Gulland et al. |
| 10,700,695 B1 | 6/2020 | Far |
| 2003/0225716 A1 | 12/2003 | Shi et al. |
| 2005/0218984 A1 | 10/2005 | Yin |
| 2007/0086655 A1 | 4/2007 | Simard et al. |
| 2009/0167579 A1 * | 7/2009 | Kawano .............. H03M 1/0678 341/135 |
| 2009/0179783 A1 * | 7/2009 | Matumoto .............. H03M 1/68 341/135 |
| 2010/0079320 A1 * | 4/2010 | Wang .................. H03M 1/1033 341/120 |
| 2012/0126852 A1 | 5/2012 | Shin et al. |
| 2014/0354865 A1 * | 12/2014 | Yun ....................... H03M 1/144 348/308 |
| 2016/0026912 A1 | 1/2016 | Falcon et al. |
| 2016/0239706 A1 | 8/2016 | Dijkman et al. |
| 2016/0246506 A1 | 8/2016 | Hebig et al. |
| 2016/0328647 A1 | 11/2016 | Lin et al. |
| 2017/0195601 A1 * | 7/2017 | Yun .................... H04N 5/37455 |
| 2017/0200094 A1 | 7/2017 | Bruestle et al. |
| 2019/0286953 A1 | 9/2019 | Farhadi et al. |
| 2019/0325269 A1 | 10/2019 | Bagherinezhad et al. |
| 2020/0184037 A1 | 6/2020 | Zatloukal et al. |
| 2020/0184044 A1 | 6/2020 | Zatloukal |

OTHER PUBLICATIONS

Ali Far, "Compact ultra low power class AB buffer amplifier," 2017 IEEE International Autumn Meeting on Power, Electronics and Computing (ROPEC), Ixtapa, 2017, pp. 1-6.

Ali Far, "Subthreshold current reference suitable for energy harvesting: 20ppm/C and 0.1%/V at 140nW," 2015 IEEE International Autumn Meeting on Power, Electronics and Computing (ROPEC), Ixtapa, 2015, pp. 1-4.

Ali Far, "Amplifier for energy harvesting: Low voltage, ultra low current, rail-to-rail input-output, high speed," 2016 IEEE International Autumn Meeting on Power, Electronics and Computing (ROPEC), Ixtapa, 2016, pp. 1-6.

Ali Far, "Class AB amplifier with noise reduction, speed boost, gain enhancement, and ultra low power," 2018 IEEE 9th Latin American Symposium on Circuits & Systems (LASCAS), Puerto Vallarta, Mexico, 2018, pp. 1-4.

Ali Far, "Low noise rail-to-rail amplifier runs fast at ultra low currents and targets energy harvesting," 2017 IEEE International Autumn Meeting on Power, Electronics and Computing (ROPEC), Ixtapa, 2017, pp. 1-6.

Ali Far, "A 5µW fractional CMOS bandgap voltage and current reference," 2013 IEEE Global High Tech Congress on Electronics, Shenzhen, 2013, pp. 7-11.

Ali Far, "A 400nW CMOS bandgap voltage reference," 2013 International Conference on Electrical, Electronics and System Engineering (ICEESE), Kuala Lumpur, 2013, pp. 15-20.

Ali Far, "Enhanced gain, low voltage, rail-to-rail buffer amplifier suitable for energy harvesting," 2017 IEEE International Autumn Meeting on Power, Electronics and Computing (ROPEC), Ixtapa, 2017, pp. 1-6.

Ali Far, "Subthreshold bandgap voltage reference aiming for energy harvesting: 100na, 5 ppm/c, 40 ppm/v, psrr-88db," 2015 IEEE 5th International Conference on Consumer Electronics—Berlin (ICCE-Berlin), Berlin, 2015, pp. 310-313.

(56) References Cited

OTHER PUBLICATIONS

Ali Far, "A 220nA bandgap reference with 80dB PSRR targeting energy harvesting," 2016 IEEE Canadian Conference on Electrical and Computer Engineering (CCECE), Vancouver, BC, 2016, pp. 1-4.

Ali Far, "Sub-1 volt class AB amplifier with low noise, ultra low power, high-speed, using winner-take-all," 2018 IEEE 9th Latin American Symposium on Circuits & Systems (LASCAS), Puerto Vallarta, Mexico, 2018, pp. 1-4.

Ali Far, "A low supply voltage 2μW half bandgap reference in standard sub-μ CMOS," 2014 IEEE International Conference on Electronics, Computing and Communication Technologies (CONECCT), Bangalore, 2014, pp. 1-5.

Ali Far, "Current reference for energy harvesting: 50um per side, at 70 nW, regulating to 125C," 2014 IEEE International Autumn Meeting on Power, Electronics and Computing (ROPEC), Ixtapa, 2014, pp. 1-5.

Qing Dong et al., "A 0.3V VDDmin 4+2T SRAM for searching and in-memory computing using 55nm DDC technology," 2017 Symposium on VLSI Circuits, Kyoto, 2017, pp. C160-C161, doi: 10.23919/VLSIC.2017.8008465.

Yen-Cheng Chiu et al., "A 4-Kb 1-to-8-bit Configurable 6T SRAM-Based Computation-in-Memory Unit-Macro for CNN-Based AI Edge Processors," in IEEE Journal of Solid-State Circuits, doi: 10.1109/JSSC.2020.3005754.

Jingcheng Wang et al., "A 28-nm Compute SRAM With Bit-Serial Logic/Arithmetic Operations for Programmable In-Memory Vector Computing," in IEEE Journal of Solid-State Circuits, vol. 55, No. 1, pp. 76-86, Jan. 2020, doi: 10.1109/JSSC.2019.2939682.

Daniel Bankman et al., "An Always-On 3.8 $\mu$ J/86% CIFAR-10 Mixed-Signal Binary CNN Processor With All Memory on Chip in 28-nm CMOS," in IEEE Journal of Solid-State Circuits, vol. 54, No. 1, pp. 158-172, Jan. 2019, doi: 10.1109/JSSC.2018.2869150.

Gobinda Saha et al "An Energy-Efficient and High Throughput in-Memory Computing Bit-Cell With Excellent Robustness Under Process Variations for Binary Neural Network," in IEEE Access, vol. 8, pp. 91405-91414, 2020, doi: 10.1109/ACCESS.2020.2993989.

Han-Chun Chen et al., "Configurable 8T SRAM for Enbling in-Memory Computing," 2019 2nd International Conference on Communication Engineering and Technology (ICCET), Nagoya, Japan, 2019, pp. 139-142, doi: 10.1109/ICCET.2019.8726871.

James Clay et al., "Energy-efficient and reliable in-memory classifier for machine-learning applications," in IET Computers & Digital Techniques, vol. 13, No. 6, pp. 443-452, Nov. 2019, doi: 10.1049/iet-cdt.2019.0040.

Naveen Verma et al., "In-Memory Computing: Advances and Prospects," in IEEE Solid-State Circuits Magazine, vol. 11, No. 3, pp. 43-55, Summer 2019, doi: 10.1109/MSSC.2019.2922889.

Yu Wang, "Neural Networks on Chip: From CMOS Accelerators to In-Memory-Computing," 2018 31st IEEE International System-on-Chip Conference (SOCC), Arlington, VA, 2018, pp. 1-3, doi: 10.1109/SOCC.2018.8618496.

Hossein Valavi et al., "A Mixed-Signal Binarized Convolutional-Neural-Network Accelerator Integrating Dense Weight Storage and Multiplication for Reduced Data Movement," 2018 IEEE Symposium on VLSI Circuits, Honolulu, HI, 2018, pp. 141-142, doi: 10.1109/VLSIC.2018.8502421.

Hossein Valavi et al., "A 64-Tile 2.4-Mb In-Memory-Computing CNN Accelerator Employing Charge-Domain Compute," in IEEE Journal of Solid-State Circuits, vol. 54, No. 6, pp. 1789-1799, Jun. 2019, doi: 10.1109/JSSC.2019.2899730.

Yinqi Tang et al., "Scaling Up In-Memory-Computing Classifiers via Boosted Feature Subsets in Banked Architectures," in IEEE Transactions on Circuits and Systems II: Express Briefs, vol. 66, No. 3, pp. 477-481, Mar. 2019, doi: 10.1109/TCSII.2018.2854759.

Jinato Zhang et al. "A machine-learning classifier implemented in a standard 6T SRAM array," 2016 IEEE Symposium on VLSI Circuits (VLSI-Circuits), Honolulu, HI, 2016, pp. 1-2, doi: 10.1109/VLSIC.2016.7573556.

Jinato Zhang et al. "An In-memory-Computing DNN Achieving 700 TOPS/W and 6 TOPS/mm2 in 130-nm CMOS," in IEEE Journal on Emerging and Selected Topics in Circuits and Systems, vol. 9, No. 2, pp. 358-366, Jun. 2019, doi: 10.1109/JETCAS.2019.2912352.

Akhilesh Jaiswal et al.,"8T SRAM Cell as a Multibit Dot-Product Engine for Beyond Von Neumann Computing," in IEEE Transactions on Very Large Scale Integration (VLSI) Systems, vol. 27, No. 11, pp. 2556-2567, Nov. 2019, doi: 10.1109/TVLSI.2019.2929245.

Jinsu Lee et al., "A 17.5-fJ/bit Energy-Efficient Analog SRAM for Mixed-Signal Processing," in IEEE Transactions on Very Large Scale Integration (VLSI) Systems, vol. 25, No. 10, pp. 2714-2723, Oct. 2017, doi: 10.1109/TVLSI.2017.2664069.

Qing Dong et al., "15.3 A 351TOPS/W and 372.4GOPS Compute-in-Memory SRAM Macro in 7nm FinFET CMOS for Machine-Learning Applications," 2020 IEEE International Solid-State Circuits Conference—(ISSCC), San Francisco, CA, USA, 2020, pp. 242-244, doi: 10.1109/ISSCC19947.2020.9062985.

\* cited by examiner

CURRENT MODE MULTIPLY-ACCUMULATE FOR COMPUTE IN MEMORY BINARIZED NEURAL NETWORKS

CROSS-REFERENCE TO RELATED PATENT APPLICATIONS

The present application is a continuation-in-part of and claims the benefit of priority from U.S. patent application Ser. No. 16/746,897 filed Jan. 19, 2020. The present application also claims the benefit of priority of U.S. Provisional Patent Application Ser. No. 62/912,407 filed Oct. 8, 2019. Both applications are hereby incorporated by reference as if fully set forth herein.

FIELD OF DISCLOSURE

The present disclosure relates to improvements in multiply-accumulate operations in binarized neural networks (BNN) utilizing digital-to-analog current-mode signal processing in integrated circuits (IC).

BACKGROUND

Matrix multiplication via a multiply-accumulate operation (MAC) is a fundamental computation function required in machine learning. Digital computation engines based on expensive and advanced deep sub-micron semiconductor manufacturing can perform large numbers of complex multiply-accumulate operations in the cloud with precision and speed, but are generally power hungry and costly, and have latency delays. Typically, cloud related latency and digital power consumption of digital machine learning ICs are prohibitive for some near the edge, at the edge, or on sensor applications. Moreover, while the cost of expensive ICs can be amortized over a longer life cycle attributed to chips deployed in the cloud, the same may not be acceptable for ICs on or near sensors or at the edge of the network. Machine learning for edge based and or on device ICs generally have a shorter life cycle, and as such they cannot afford being expensive. Also, on device or sensor machine learning ICs generally target mass market or consumer applications that are much more price sensitive than machine learning ICs that are deployed in the cloud datacenters. More importantly, safety and privacy concern may prohibit some sensors and edge devices from delegating their machine learning tasks to the cloud. Imagine if a heart pace maker, hearing aid, or residence digital electronics (e.g., smart door opener, smart fire place control, smart home surveillance video, etc.) being sent on the cloud and intercepted and hacked. As such, machine learning computation tasks on edge of the network or near sensors or on sensors, generally speaking, must perform their machine learning computation locally and not on the cloud for safety and latency concerns as well as for low-cost reasons. Because of shorter life cycles of edge-based devices which may target cost sensitive consumer or large volume mass market, the price cannot be expensive, which precludes fabricating such computational ICs with short life cycles on advanced deep-micron manufacturing where the tooling and wafer costs are very high.

Moreover, we are near or at the end of Moore's Law which means the semiconductor industry and ICs can not bank on chip costs to, for example, go down by half every year going forward (like it has been doing for the last few decades). In other words, companies may not risk inventing today on future mass markets by banking on expensive digital machine learning ICs, whose prices may not go down much from here.

In summary, low current consumption, low voltage power supply, asynchronous operations, safe and private (near or on device and sensor) machine learning ICs are needed, in order for smart devices and smart sensor to become free from the binds of the cloud (based machine learning), free from binds of wire, free from frequent battery recharge, and freedom from some remote intelligence that is channeled through (smart) devices or (smart) sensors onto public communications networks (which may be hacked, corrupted, or lost).

Latency and delays associated with computations delegated to the cloud can be restrictive or prohibitive for some machine learning applications, which makes computation on devices and or sensors essential.

Moreover, on-or-near-device and sensor machine learning ICs must be manufacturable inexpensively, and be based on low-cost, non-advanced shallow sub-micron (as opposed to expensive deep sub-micron) fabrication technologies. Low cost machine learning ICs are needed in order to meet the shorter life cycles (that mandates lower amortization cost of tooling and fabrication over the shorter life of the IC) and volume maximizing needs of mass market or consumer centric on or near device and sensor applications.

SUMMARY OF THE INVENTION

It is an objective of the present disclosure to provide improvements to MACs for BNN including but not limited to the following, in part or combination thereof:

An objective of this disclosure is to provide mixed-signal ICs for MAC in BNNs that enables machine learning on sensors and or devices that is safe, private, and having minimal latency delays.

Another objective of this disclosure is to provide mixed-signal IC for MAC in BNNs that is small and low cost.

Another objective of this disclosure is to provide mixed-signal IC for MAC in BNNs that can operate with low power supply voltage ($V_{DD}$).

Another objective of this disclosure is to provide mixed-signal IC for MAC in BNNs including the option of being arranged with in-memory-compute (IMC) having low dynamic power consumption due to read-write cycles in and out of memory.

Another objective of this disclosure is to provide mixed-signal IC for MAC in BNNs that consumes low DC and stand-by operating current.

Another objective of this disclosure is to provide mixed-signal IC for MAC in BNNs with the option of operating free from clock and asynchronously, which minimizes latency delay and reduces free clock related power consumption.

Another objective of this disclosure is to provide mixed-signal IC for MAC in BNNs wherein internal analog signal full-scale to zero-scale span (e.g., summing node of a MAC or analog input of an Analog-To-Digital-Converter or analog input of a comparator) is less restricted by $V_{DD}$.

Another objective of this disclosure is to provide mixed-signal IC for MAC in BNNs that can be manufacturable on low-cost, readily available, multi-source, and conventional Complementary-Metal-Oxide-Semiconductor (CMOS) fabrication.

Another objective of this disclosure is to provide mixed-signal IC for MAC in BNNs with the option of not requiring passive resistors and or capacitors, thus providing the option that MAC's performance is mostly independent of passive resistors and or capacitors, which can help lower costs and improve the manufacturing yield.

Another objective of the present disclosure is for a meaningful portion of the computation circuitry to shut itself off (i.e. 'smart self-power-down') in the face of no incoming signal so that the computation circuits can remain 'always on' while consuming low stand-by current consumption.

Another objective of the present disclosure is to lower the sensitivity of operating currents, bias currents, reference currents, summing current, and or output currents to power supply variations.

Another objective of the present disclosure is to lower the sensitivity of operating currents, bias currents, and reference currents to normal manufacturing variations (e.g., normal threshold voltage variations of transistor), which could improve the silicon die yield and lower the IC cost.

Another objective of this disclosure is to provide mixed-signal IC for MAC in BNNs with the option of operating in current mode.

Another objective of this disclosure is to provide mixed-signal IC for MAC in BNNs that is fast.

Another objective of this disclosure is to provide mixed-signal IC for MAC in BNNs that provide an option of not requiring switching capacitors for mixed-mode signal processing.

Another objective of the present disclosure is to provide mixed-signal IC for MAC in BNNs wherein the summation and subtraction functions of the MAC can be performed in analog or mixed mode (current-mode and or voltage mode).

Another objective of the present disclosure is to provide mixed-signal IC for MAC in BNNs wherein the digital XOR and or digital XNOR function is performed with mixed signals (current-mode and or voltage mode).

Another objective of the present disclosure is to provide mixed-signal IC for MAC in BNNs wherein the both the digital XOR and or digital XNOR functions as well as the function of the summation of the outputs of plurality of digital XOR and or digital XNOR are performed with mixed signals (in current-mode and or voltage mode) in one asynchronous cycle that reduces latency delay.

Another objective of the present disclosure is to provide mixed-signal IC for MAC in BNNs wherein digital adders (which occupy larger die area) are avoided. The present disclosure aims to eliminate the digital adding function of bitwise count of logic state '1' (or ON state) in BNNs. Instead, the present disclosure aims to perform the bitwise count of logic state '1' (or ON state) in BNNs in analog current-mode. Having the objective of utilizing digital input to analog current output XOR (iXOR) and or digital input to analog current output XNOR (iXNOR), the current outputs of plurality (e.g., 1000s) of iXOR and or iXNOR can be simply coupled together, in order to perform the summation (counting of logic state '1') function in mixed-signal current mode in one shot, asynchronously, and in an area efficient (low cost) manner.

Another objective of the present disclosure is for the non-linearity due to the non-systematic random statistical contribution of mismatches of the adding current mode signals to be accumulated by the square root of the sum of the squares of such non-systematic random mismatches attributed to the plurality of the summing current signals.

Another objective of the present disclosure is for monotonic incremental accumulation of adding current signals.

An aspects of the embodiments disclosed herein include an method of performing a multiply-accumulate operation (MAC) for binarized neural networks in an integrated circuit, the method comprising: supplying a regulated current source ($I_{PSR}$) having a value of $I_{PSR}$, mirroring and scaling $I_{PSR}$ onto a plurality of current sources ($I_S$), each having a value $I_{SV}$ that is proportional to $I_{PSR}$; individually gating each $I_S$ in the plurality of $I_S$ current sources, each gating responsive to a logical combination of one of an XOR, and an XNOR of a corresponding pair of digital input signals (x, w) to generate a plurality of corresponding analog-output current sources ($I_{SX}$), wherein each of the $I_{SX}$ current sources has a value that swings between substantially zero and substantially $I_{SV}$ responsive to the logical combination of the one of the XOR, and the XNOR of the corresponding pair of digital input signals x, w; combining the plurality of $I_{SX}$ current sources to generate an analog summation current ($I_{S_{1count}}$), wherein $I_{S_{1count}}$ is a cumulative analog output signal representing a cumulative bitwise count of the logical combination of each of the one of the XOR, and the XNOR of the corresponding pair of digital input signals; coupling the $I_{S_{1count}}$ current with at least one of a current input comparator (iCOMP), and a current input Analog-to-Digital-Converter (iADC); wherein each of the $I_{SX}$ current sources forms at least one of a single analog current output ($I_o$) and a differential analog current output ($I_{o1}$, $I_{o2}$); wherein the $I_{S_{1count}}$ forms at least one of a single analog current ($I_{SO}$) and a differential analog current pair ($I_{SO1}$, $I_{SO2}$); and wherein the at least one of the current input iCOMP, and the current input Analog-To-Digital-Converter (iADC), each receives at least one of the $I_{SO}$, and the $I_{SO1}$, $I_{SO2}$. Further aspects of the embodiments disclosed herein include the method of performing a multiply-accumulate operation for binarized neural networks in an integrated circuit of claim 1, the method further comprising: controlling the individually gating each $I_S$ in the plurality of $I_S$ current sources in a respective analog current switch (iSW). Further aspects of the embodiments disclosed herein include the method of performing a multiply-accumulate operation for binarized neural networks in an integrated circuit of claim 1, the method further comprising: controlling the individually gating each $I_S$ in the plurality of $I_S$ current sources via a corresponding analog current switch (iSW) at one of a gate port, a source port, and a drain port of each $I_S$ current source. Further aspects of the embodiments disclosed herein include the method of performing a multiply-accumulate operation for binarized neural networks in an integrated circuit of claim 1, the method further comprising: coupling the at least one of the $I_{SO}$ to a single-ended current output of a current mode Bias DAC (iDAC). Further aspects of the embodiments disclosed herein include the method of performing a multiply-accumulate operation for binarized neural networks in an integrated circuit of claim 1, the method further comprising: coupling the at least one of the $I_{SO1}$, $I_{SO2}$ pair to a differential current output of a current mode Bias DAC (iDAC). Further aspects of the embodiments disclosed herein include the method of performing an multiply-accumulate operation for binarized neural networks in an integrated circuit of claim 1, the method further comprising: storing at least one of the pair of digital input signals x, w in at least one of a SRAM array, a SRAM array, a EPROM array, and $E^2$PROM. Further aspects of the embodiments disclosed herein include the method of performing multiply-accumulate for binarized neural networks in integrated circuits of claim 1, the method further comprising: controlling the individually gating each $I_S$ in the plurality of $I_S$ current sources to generate each corresponding $I_{o1}$ and $I_{o2}$ comprising: operating a differential pair comprising a first transistor ($M_1$) and a second transistor ($M_2$), with a quiescent current source ($I_Q$), wherein $I_Q$ has a current source value proportional to the $I_S$ current source value, and wherein each transistor comprises a drain-port, a gate-port, and a source-port; controlling the gate-ports of the $M_1$ and the $M_2$ with a pair of first bipolar digital signals (w, $\overline{w}$), wherein currents in drain-ports of the $M_1$ and the $M_2$ are responsive to w, $\overline{w}$; feeding a current into the drain-port of the $M_1$ onto a common source port of a second differential pair, wherein the second differential pair comprises a third transistor ($M_3$) and a fourth transistor ($M_4$), and wherein each transistor comprises a drain-port, a gate-port, and a source-port; controlling the gate-ports of the $M_3$ and the $M_4$ with a pair of first bipolar digital signals (x, $\overline{x}$), wherein currents in the drain-ports of the $M_3$ and the $M_4$ are responsive to x, $\overline{x}$; feeding a current in the drain-port of the $M_2$ onto a common source port of a third differential pair, wherein the third differential pair comprises a fifth transistor ($M_5$) and a sixth transistor ($M_6$), and wherein each transistor comprises a drain-port, a gate-port, and a source-port; controlling the gate-ports of the $M_5$ and the $M_6$ with $\overline{x}$, x, wherein currents in the drain-ports of the $M_5$ and the $M_6$ are responsive to $\overline{x}$, x; coupling the drain port of the $M_3$ with at least one of the drain ports of the $M_5$ and the $M_6$ to form the first current analog output $I_{o1}$; and coupling the drain port of the $M_4$ with at least one of the drain ports of the $M_5$ and the $M_6$ to form the second current analog output $I_{o2}$. Further aspects of the embodiments disclosed herein include the method of performing multiply-accumulate for binarized neural networks in integrated circuits of claim 1, the method further comprising: controlling the individually gating each $I_S$ in the plurality of $I_S$ current sources to generate each corresponding $I_o$ comprising: coupling a first and a second transistor in series to arrange a first serialized composite transistor ($iSW_1$), wherein the first and the second transistors each function as an analog switch comprising two analog ports and a digital control port, and wherein the $iSW_1$ functions as a first composite analog switch comprising two analog ports and two digital control ports; coupling a third and a fourth transistor in series to arrange a second serialized composite transistor ($iSW_2$), wherein the third and the fourth transistors each function as an analog switch comprising two analog ports and a digital control port, and wherein the $iSW_2$ functions as a second composite analog switch comprising two analog ports and two digital control ports; coupling the two respective analog ports of the $iSW_1$ and the $iSW_2$ to arrange the $iSW_1$ and the $iSW_2$ in parallel forming a series-parallel composite transistor ($iSW_{SP}$) comprising two analog ports and two digital control ports; controlling the first and the third transistors with at least one pair of digital signals w, $\overline{w}$ and its opposite $\overline{w}$, w; controlling the second and the fourth transistors with at least one pair of digital signals x, $\overline{x}$ and its opposite $\overline{x}$, x; combining the $iSW_{SP}$ with at least one of the plurality of $I_S$ current sources to form at least one of the $I_o$. Further aspects of the embodiments disclosed herein include the method of performing multiply-accumulate for binarized neural networks in integrated circuits of claim 1, the method further comprising: receiving a reference current signal ($I_R$) into an input port of a power supply desensitization (PSR) circuit; and regulating the $I_{PSR}$ signal to track the $I_R$, wherein the $I_{PSR}$ signal is desensitized from power supply variations.

BRIEF DESCRIPTION OF THE DRAWINGS

The subject matter presented herein is illustrated by way of example, and not by way of limitation, in the figures of the accompanying drawings and illustrations, and in which like reference numerals refer to similar elements, and in which.

Figure 11:
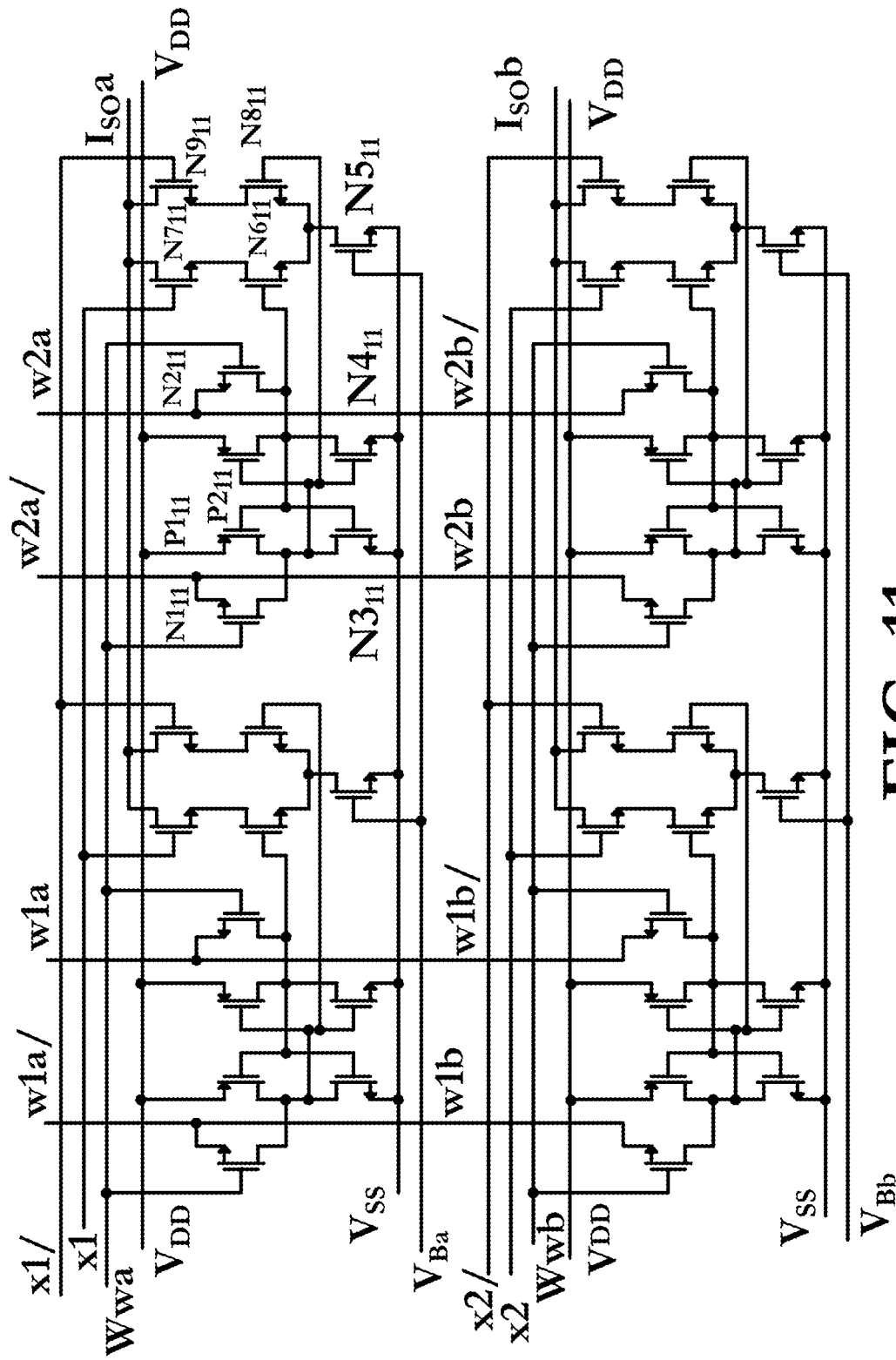
FIG. 11 is a simplified circuit schematic of an embodiment illustrating a single-ended iMAC for BNN with CIM. The embodiment disclosed in FIG. 11 is similar to that of FIG. 10 with the difference being that 6 transistor SRAM array is utilized instead of a latch array. Plurality of circuits similar to that of FIG. 7 equip plurality of mixed-mode XNORs (with digital input to single-ended analog output currents) to be arranged in a SRAM memory array with CIM. The digital weight ($w_i$) data-set is stored in the SRAM array while the respective $x_i$ digital signals are inputted to the iMAC for BNNs. As a result, plurality of rows (e.g., rows a and b) of single-ended sums of analog-output currents (e.g., $I_{SO}a$ and $I_{SO}b$) are generated that represent the analog equivalent of the digital sum of the plurality of respective $\overline{x_i \oplus w_i}$ function.
Figures 12, 13:
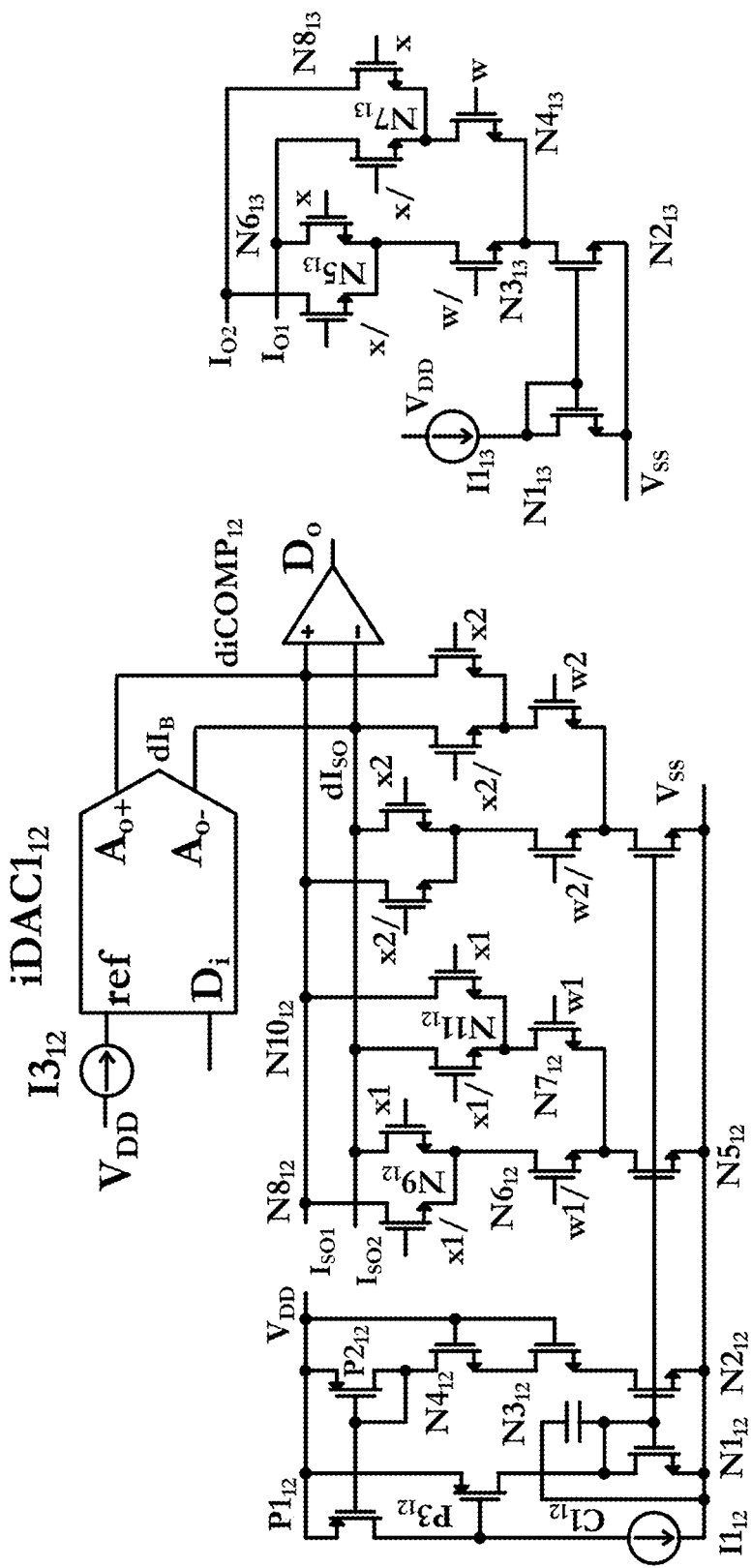
FIG. 12 is a simplified circuit schematic of an embodiment illustrating a differential iMAC for a BNN. It comprises a power supply desensitization (PSR) circuit that regulates an $I_{PSR}$ current supplied onto a plurality (e.g., pair) of digital-input analog-out current XOR (iXOR) similar to that of the circuit in FIG. 13. Differential output currents of plurality of analog output currents of plurality of iXOR are accumulated differentially ($dI_{SO} = I_{SO1} - I_{SO2}$) and added to a differential bias current $dI_B$, wherein $dI_B$ is generated by a differential Bias iDAC. A differential current-input comparator (diCOM) generates the sign of the net result of $dI_{SO} + dI_B$.
FIG. 13 is a simplified circuit schematic of a differential analog output current XNOR and or XOR. The differential analog output currents are generated via a differential pair (biased by a MOS current source), wherein the outputs of the differential pair are each coupled with the common source ports of another differential pair.
Figure 14:
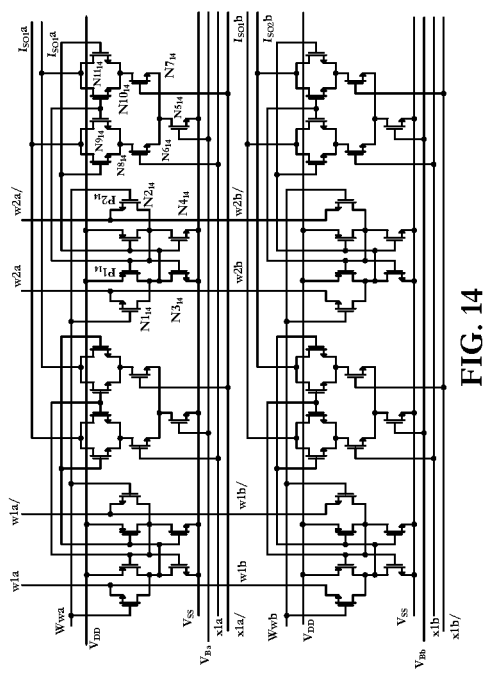
FIG. 14 is a simplified circuit schematic of an embodiment illustrating a differential iMAC for BNN with CIM, wherein the CIM utilizes SRAMs.

The embodiment disclosed in FIG. 14 is similar to that of FIG. 11 with the difference being that an array of differential iXOR (similar to the circuit depicted in FIG. 13) is utilized instead of a single-ended iXOR array (utilized in FIG. 11).

DETAILED DESCRIPTION

Numerous embodiments are described in the present application and are presented for illustrative purposes only and is not intended to be exhaustive. The embodiments were chosen and described to explain principles of operation and their practical applications. The present disclosure is not a literal description of all embodiments of the disclosure(s). The described embodiments also are not, and are not intended to be, limiting in any sense. One of ordinary skill in the art will recognize that the disclosed embodiment(s) may be practiced with various modifications and alterations, such as structural, logical, and electrical modifications. For example, the present disclosure is not a listing of features which must necessarily be present in all embodiments. On the contrary, a variety of components are described to illustrate the wide variety of possible embodiments of the present disclosure(s). Although particular features of the disclosed embodiments may be described with reference to one or more particular embodiments and/or drawings, it should be understood that such features are not limited to usage in the one or more particular embodiments or drawings with reference to which they are described, unless expressly specified otherwise. The scope of the disclosure is to be defined by the claims.

Although process (or method) steps may be described or claimed in a particular sequential order, such processes may be configured to work in different orders. In other words, any sequence or order of steps that may be explicitly described or claimed does not necessarily indicate a requirement that the steps be performed in that order. The steps of processes described herein may be performed in any order possible. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to the embodiment(s). In addition, although a process may be described as including a plurality of steps, that does not imply that all or any of the steps are essential or required. Various other embodiments within the scope of the described disclosure(s) include other processes that omit some or all of the described steps. In addition, although a circuit may be described as including a plurality of components, aspects, steps, qualities, characteristics and/or features, that does not indicate that any or all of the plurality are essential or required. Various other embodiments may include other circuit elements or limitations that omit some or all of the described plurality. In U.S. applications, only those claims specifically citing "means for" or "step for" should be construed in the manner required under 35 U.S.C. § 112(f).

Throughout this disclosure, the terms FET is field-effect-transistor; MOS is metal-oxide-semiconductor; MOSFET is MOS FET; PMOS is p-channel MOS; NMOS is n-channel MOS; BiCMOS is bipolar CMOS; SPICE is Simulation Program with Integrated Circuit Emphasis which is an industry standard circuit simulation program; micro is $\mu$ which is $10^{-6}$; nano is n which is $10^{-9}$; and pico is p which is $10^{-12}$. Bear in mind that $V_{DD}$ (as a positive power supply) and $V_{SS}$ (as a negative power supply) are applied to all the circuitries, block, or systems in this disclosure, but may not be shown for clarity of illustrations. The $V_{SS}$ may be connected to a negative power supply or to the ground (zero) potential. Body terminal of MOSFETs can be connected to their respective source terminals or to the MOSFET's respective power supplies, $V_{DD}$ and $V_{SS}$.

Keep in mind that for descriptive clarity, illustrations of this disclosure are simplified, and their improvements beyond simple illustrations would be obvious to one skilled in the arts. For example, it would be obvious for one skilled in the art that MOSFET current sources can be cascoded for higher output impedance and lower sensitivity to power supply variations, whereas throughout this disclosure current sources are depicted with a single MOSFET for clarity of illustrations. Another example, it would also be obvious to one skilled in the art that a circuit design (such as the ones illustrated in this disclosure) can be arranged with NMOS transistors, and or its complementary version utilizing transistors such as PMOS type.

The illustrated circuit schematics of embodiments described in the proceeding sections have the following benefits which are summarized here to avoid their repetitions in each section for sake of clarity and brevity:

First, mixed-signal current-mode circuit designs in this disclosure are suitable for MAC in BNNs.

Second, plurality of mixed-signal current-mode circuit designs in this disclosure take small silicon die area which makes them cost-effective for MAC in BNNs that may require thousands of such circuits in one chip.

Third, because voltage swings are small in current mode signal processing, the disclosed mixed-signal current-mode circuit designs can enable MAC in BNNs that are fast.

Fourth, also because current mode signal processing can be made fast, the disclosed mixed-signal current-mode circuit designs utilized in MAC in BNNs can provide a choice of trade-off and flexibility between running at moderate speeds and operating with low currents to save on power consumption.

Fifth, in part because the disclosed mixed-signal current-mode circuit designs can be arranged on a silicon die right next to memory (e.g., SRAM, EPROM, E$^2$PROM, etc.) as in Compute-In-Memory (CIM) MAC in BNNs. Such an arrangement reduces the read/write cycles in an out of memory and thus lowers dynamic power consumption.

Sixth, the disclosed mixed-signal current-mode circuit designs can be clock-free, providing computations for MAC in BNNs to operate asynchronously which minimizes latency delay.

Seventh, the disclosed mixed-signal current-mode circuit designs can be clock-free and capacitor-free for MAC in BNNs which provide an option of not requiring switching capacitors for mixed-mode signal processing. This arrangement avoids the extra cost of capacitors on silicon and lowers the dynamic power consumption attributed to switching the capacitors and the clocking updates.

Eight, performance of the disclosed mixed-signal current-mode circuit designs can be arranged to be independent of resistors and capacitor values and their normal variations in manufacturing. Benefits derived from such independence is passed onto the MAC in BNNs that utilize the disclosed circuits. As such, die yield to perform to specifications can be made mostly independent of passive resistors and or capacitors values and their respective manufacturing variations which could otherwise reduce die yield and increase cost.

Ninth, because voltage swings are small in current mode signal processing, the disclosed mixed-signal current-mode circuit designs here can enable MAC in BNNs to operate with low power supply voltage ($V_{DD}$).

Tenth, also because voltage swings are small in current mode signal processing, the disclosed mixed-signal current-mode circuit designs can enable internal analog signal to span between full-scale and zero-scale (e.g., summing node of a MAC or analog input of an Analog-To-Digital-Converter or analog input of a comparator) which enables the full-scale dynamic range of MAC in BNNs to be less restricted by $V_{DD}$.

Eleventh, the disclosed mixed-signal current-mode circuit designs for MAC in BNNs that can be manufactured on low-cost standard and conventional Complementary-Metal-Oxide-Semiconductor (CMOS) fabrication which are more mature, readily available, and process node portable, which helps MAC in BNNs ICs with more rugged reliability, and multi-source manufacturing flexibility as well as lower manufacturing cost.

Twelfth, digital addition and digital subtraction occupy larger die area. Because the disclosed circuit designs operate in current mode, the function of addition in current mode simply requires the coupling of output current ports. The function of subtraction in current mode can be arranged via a current mirror. Thus, the disclosed circuit designs utilized in MAC in BNNs can be smaller and lower less.

Thirteenth, digital XOR and XNOR functions are required in BNNs. The present disclosure arranges the XOR and XNOR functions to be performed in mixed-signal current-mode for MAC in BNNs.

Fourteenth, plurality of XOR and or XNOR outputs are required to be accumulated for BNNs. The present disclosure provides digital-input to analog-output current XOR and or XNOR circuit designs suitable for mixed-signal MAC in BNNs. The plurality of output currents of plurality of XOR and or XNOR are couple together to perform the function of addition asynchronously, which reduces latency delays substantially.

Fifteenth, as noted earlier, digital addition and subtraction functions occupy large die areas and can be expensive. The present disclosure eliminates the digital adding function of bitwise count of logic state '1' (or ON state) in BNNs. Instead, the present disclosure performs the bitwise count of logic state '1' (or ON state) in BNNs in analog current-mode. By utilizing digital input to analog current output XOR (iXOR) and or digital input to analog current output XNOR (iXNOR), the current outputs of plurality (e.g., 1000s) of iXOR and or iXNOR are simply coupled together, which performs the summation (counting of logic state '1') in mixed-signal current mode and in an area efficient (low cost) manner.

Sixteenth, the disclosed mixed-signal current-mode circuit designs utilized in MAC in BNNs help reduce inaccuracies attributed to the function of addition that stems from random but normal manufacturing variation (e.g., random transistor mismatches in normal fabrication). In the disclosed mixed-signal current-mode circuit designs, the non-linearity due to the non-systematic random statistical contribution of mismatches of adding the current signals roughly equals to the square root of the sum of the squares of such non-systematic random mismatches (attributed to the plurality of the summing signals). Such benefit of attenuated impact of imperfections (due to random manufacturing variations) on overall accuracy is an inherent advantage of the disclosed designs which can improve manufacturing yield to specifications that is passed on to the MAC in BNNs.

Seventeenth, cascoding current source can help increase output impedance and reduce sensitivity of output currents to power supply variation, but require two cascoded transistors. This disclosure provides the option of utilizing a power supply desensitization circuit for a current source that is not cascoded (e.g., single MOSFET current source) which save on area, considering a large number (e.g., 10s of 1000s) of iXOR (and or iXNOR) that may be required in MAC in BNNs.

Eighteenth, because each unit of cumulative current (that represents the bitwise count of logic state '1' at the output of each iXOR and or iXNOR) are equal to one another, the incremental summation of plurality of output currents is thermometer-like. Accordingly, the disclosed mixed-signal current-mode circuit designs utilized in MAC for BNNs provides monotonic incremental accumulation of adding current signals which is beneficial in converging on minimum cost function during training of BNNs.

Nineteenth, the disclosed mixed-signal current-mode circuit designs utilized in MAC for BNNs enables a meaningful portion of the computation circuitry to shut itself off (i.e. 'smart self-power-down') in the face of no incoming signal so that the computation circuits can remain 'always on' while consuming low stand-by current consumption.

Figure 1:
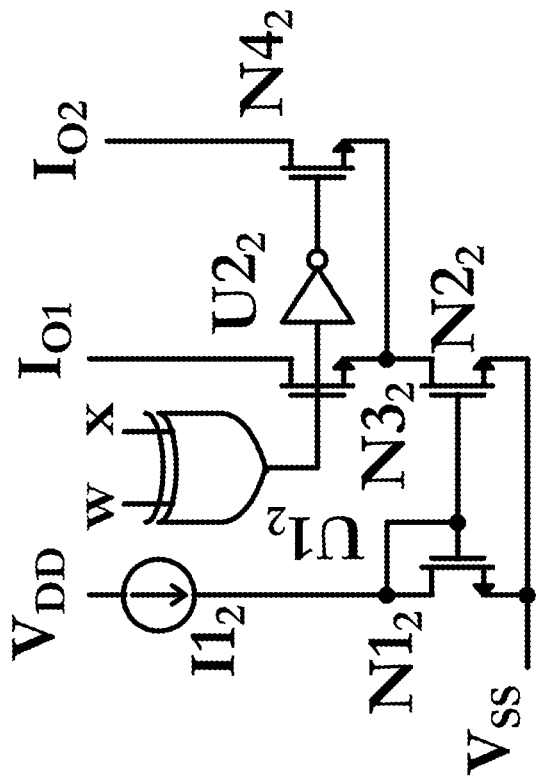
FIG. 1 is a simplified circuit schematic of an embodiment illustrating a Metal-Oxide-Semiconductor (MOS) current source gated by an XOR that controls the gate port of the MOS current source.

Section 1—Description of FIG. 1

FIG. 1 is a simplified circuit schematic of an embodiment illustrating a Metal-Oxide-Semiconductor (MOS) current source gated by an XOR that controls the gate port of the MOS current source.

The XOR (x⊕w) of $U1_1$ controls analog switches $N2_1$ and $N3_1$ which enable or disable current mirror $N1_1$, $N4_1$ and thus control the value of $I_O$ to swing to either $I1_1$ value (analog current equivalent to 'logic 1') or zero (analog current equivalent to 'logic 0').

MAC for BNNs can be arranged to receive plurality of x, w digital bits inputted to plurality of XOR to generate plurality of $I_O$ currents that can be summed to generate $I_{OS}$ (i.e., utilizing current mode summation for bitwise counting of plurality of logic state '1' of plurality of iXOR outputs for MAC in BNNs).

In this disclosure, unless otherwise specified, I1 value is the analog current equivalent to 'logic 1' and zero current is the analog current equivalent to 'logic 0'.

Figure 2:
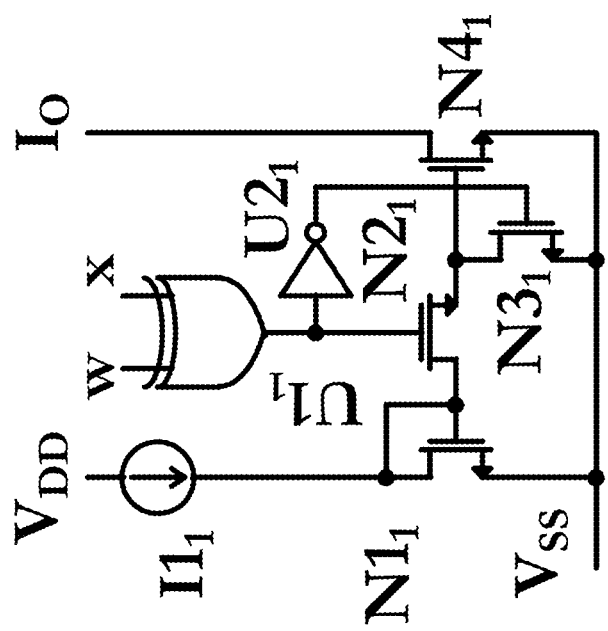
FIG. 2 is a simplified circuit schematic of another embodiment illustrating a MOS current source gated by an XOR that controls the drain port of the MOS current source.

Section 2—Description of FIG. 2

FIG. 2 is a simplified circuit schematic of another embodiment illustrating a MOS current source gated by an XOR that controls the drain port of the MOS current source.

The XOR (x⊕w) of $U1_2$ and inverter $U2_2$ controls analog switches $N3_2$ and $N4_2$ which steer the $N2_2$ current (that is mirrored and scaled from $N1_2$) to flow through either $N3_2$ to form the $I_{O1}$ current (swinging to either zero or $I1_2$) or flow through $N4_2$ to form the $I_{O2}$ current (swinging to either $I1_1$ or zero).

Similar to prior section, utilizing the disclosed embodiment of FIG. 2, MAC in BNNs can be arranged by receiving plurality of x, w digital bits inputted to plurality of XOR to generate plurality of differential $I_{O1}$ and $I_{O2}$ currents that can be summed together to generate a differential summing current pair $I_{OS1}$ and $I_{OS2}$ (i.e., utilizing current mode summation for bitwise counting of plurality of logic state '1' of plurality of iXOR outputs for MAC in BNNs).

Figure 3:
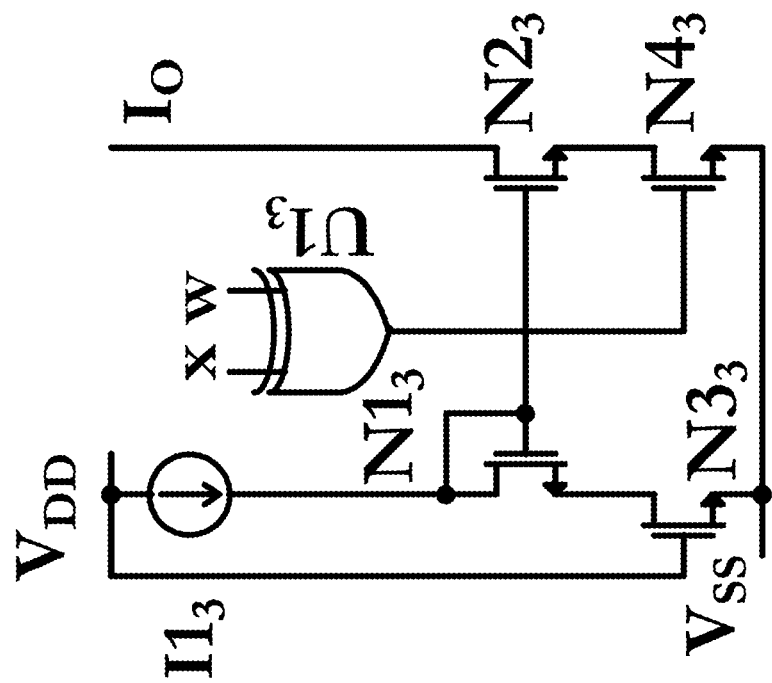
FIG. 3 is a simplified circuit schematic of another embodiment illustrating a MOS current source gated by an XOR that controls the source port of the MOS current source.

Section 3—Description of FIG. 3

FIG. 3 is a simplified circuit schematic of another embodiment illustrating a MOS current source gated by an XOR that controls the source port of the MOS current source.

The XOR (x⊕w) of $U1_3$ controls the analog switches $N4_3$ which enable or disable current mirror $N1_3$, $N2_3$ and thus controlling the value of $I_O$ to swing to either $I1_3$ value (analog current equivalent to 'logic 1') or zero (analog current equivalent to 'logic 0'). Notice that $N4_3$ and $N3_3$ are arranged with the same size for current mirror $N1_3$, $N2_3$ matching.

Like preceding sections, utilizing the embodiment of FIG. 3 in MAC for BNNs can be arranged to receive plurality of x, w digital bits inputted to plurality of iXOR to generate plurality of $I_O$ currents that can be summed together to generate a $I_{OS}$ (i.e., utilizing current mode summation for bitwise counting of plurality of logic state '1' of plurality of iXOR outputs for MAC in BNNs).

Figure 4:
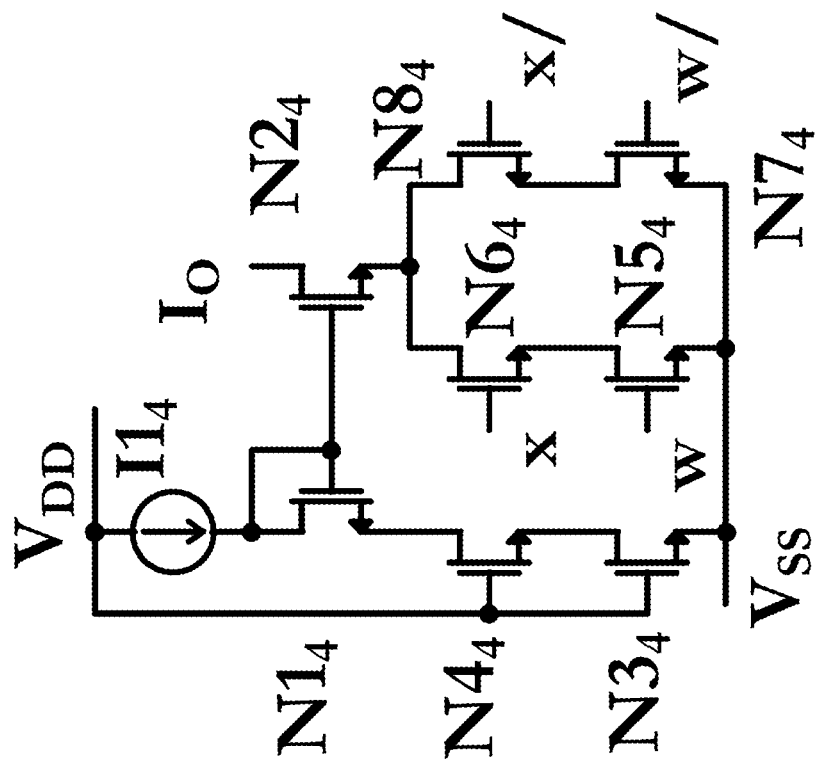
FIG. 4 is a simplified circuit schematic of an embodiment illustrating a series-parallel composite transistor ($iSW_{SP}$) combined with a MOS current source, wherein $iSW_{SP}$ is coupled with the source port of the MOS current source, and wherein the $iSW_{SP}$ comprises four transistors that can function as both as an analog switch as well as either XOR or XNOR (all in one $iSW_{SP}$).

Section 4—Description of FIG. 4

FIG. 4 is a simplified circuit schematic of an embodiment illustrating a series-parallel composite transistor ($iSW_{SP}$) combined with a MOS current source, wherein $iSW_{SP}$ is coupled with the source port of the MOS current source, and wherein the $iSW_{SP}$ comprises four transistors that function as both as an analog switch as well as either XOR or XNOR (all in one $iSW_{SP}$), which effectively can be arranged an analog-output current mode XOR (iXOR) or XNOR (iXNOR). The disclosed circuit of FIG. 4 is arranged to function as an iXNOR.

Analog switches arranged by $N5_4$ in series with $N6_4$ are controlled by x and w digital signals, respectively. Also, analog switches are arranged by placing $N7_4$ in series with $N8_4$ which are controlled by $\bar{x}$ and $\bar{w}$ digital signals, respectively. As in a digital XNOR, when x and w are both HIGH (logic 1), then the series analog switches $N5_4$ and $N6_4$ are both ON which enables $N2_4$ to scale and mirror its current from $I1_4$ of $N1_4$. Note that series combination of (always on) $N3_4$ and $N4_4$ in series with source port of $N1_4$ are the same size as $N5_4$ and $N6_4$ as well as $N7_4$ and $N8_4$ to match the current mirror loops of $N1_4$ and $N2_4$. Similarly, when digital bits x and w are both LOW (logic 0), then the series analog switches $N7_4$ and $N8_4$ are both ON which again enables $N2_4$ to scale and mirror its current from $I1_4$ of $N1_4$.

As such, the disclosed digital-input analog-output current XNOR (iXOR) function as an analog XNOR (whose output effectively controls analog current switches). The analog output current here is controlled by a meshed composite of series-parallel analog current switch $iSW_{SP}$ comprising of four transistors which can be meaningfully area efficient.

Figure 5:
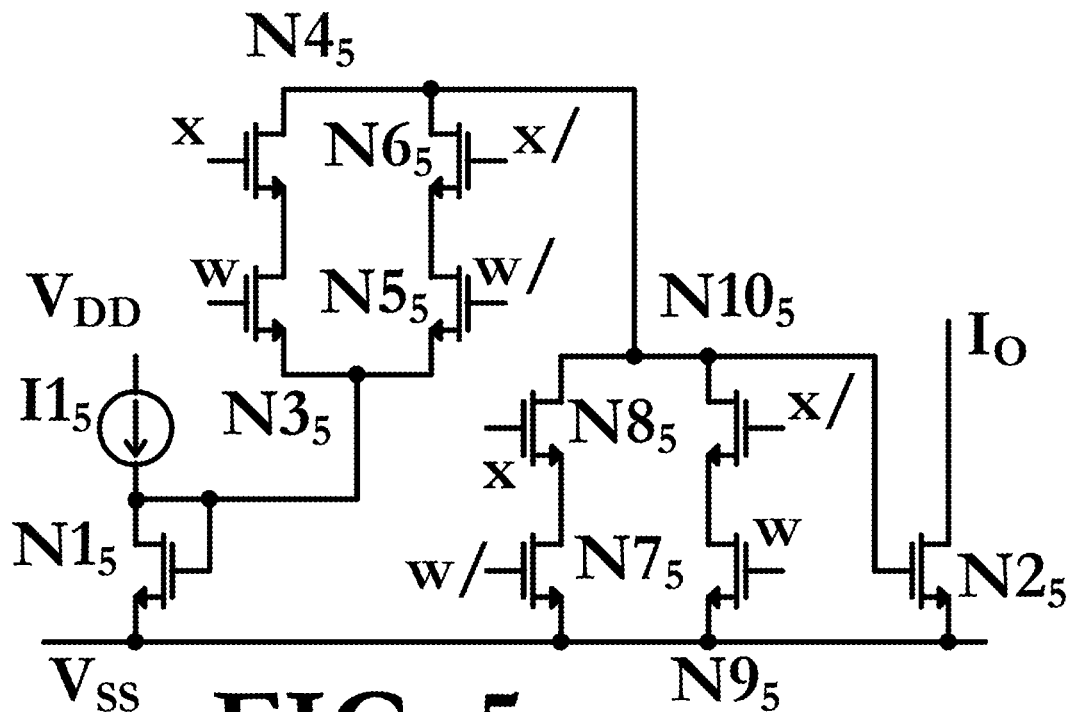
FIG. 5 is a simplified circuit schematic of an embodiment illustrating a pair of series-parallel composite transistor ($iSW_{SP}$) combined with a MOS current source, wherein a common analog input of the $iSW_{SP}$ pair is coupled with the gate port of the MOS current source, and wherein each of the $iSW_{SP}$ comprises four transistors that can function as both as an analog switch pair as well as an XNOR (all in one $iSW_{SP}$).

Similarly, utilizing the embodiment illustrated in FIG. 5 in MAC in BNNs can be arranged to receive plurality of x, w digital bits inputted to plurality of iXNOR to generate plurality of $I_O$ currents that can be summed together to generate an $I_{SO}$ (i.e., utilizing current mode summation for bitwise counting of plurality of logic state '1' of plurality of iXNOR outputs for MAC in BNNs).

Section 5—Description of FIG. 5

FIG. 5 is a simplified circuit schematic of an embodiment illustrating a pair of series-parallel composite transistor ($iSW_{SP}$) combined with a MOS current source, wherein a common analog input between the $iSW_{SP}$ pair is coupled with the gate port of the MOS current source, and wherein each of the $iSW_{SP}$ comprises four transistors that function as both as an analog switch pair as well as an XNOR (all in one $iSW_{SP}$) to effectively arranging an analog-output current mode XNOR (iXNOR).

An $iSW_{SP1}$ comprising a series combination of analog switches $N3_5$ and $N4_5$ are placed in parallel with another series combination of analog switches $N5_5$ and $N6_5$. When digital bits x, w are both HIGH (logic state '1') or both LOW (logic state '0'), then either $N3_5$ and $N4_5$ or $N5_5$ and $N6_5$ connect the gate-drain port of $N1_5$ to the gate port of $N2_5$ thus causing the operating current $I_O$ of $N2_5$ to mirror and scale that of the operating current $I1_5$ of $N1_5$.

Note that concurrently, an $iSW_{SP2}$ comprising a series combination of analog switches $N7_5$ and $N8_5$ are placed in parallel with another series combination of analog switches $N9_5$ and $N10_5$. When digital bits x, w are both HIGH or both LOW, then either series combination of $N7_5$ and $N8_5$ and or series combination of $N9_5$ and $N10_5$ remain open (i.e., composite switch is 'off'). Conversely, when x, w are in any state other than both HIGH or both LOW, then either series combination of $N7_5$ and $N8_5$ and or series combination of $N9_5$ and $N10_5$ turn 'on' and short the gate-port voltage of $N2_5$ to $V_{SS}$ which keeps the $I_O$ of $N2_5$ to zero.

Also, keep in mind that if digital bits x, w are in any state other than both HIGH or both LOW, then either series combination of $N3_5$ and $N4_5$ and or series combination of $N5_5$ and $N6_5$ turn off and isolate the gate-drain port of $N1_5$ from the grounded gate port of $N2_5$.

Similarly, utilizing the embodiment illustrated in FIG. 5 in MAC in BNNs can be arranged to receive plurality of x, w digital bits inputted to plurality of iXNOR to generate plurality of $I_O$ currents that can be summed together to generate an $I_{SO}$ in an area efficient manner (i.e., utilizing current mode summation for bitwise counting of plurality of logic state '1' of plurality of iXNOR outputs for MAC in BNNs).

Figure 6:
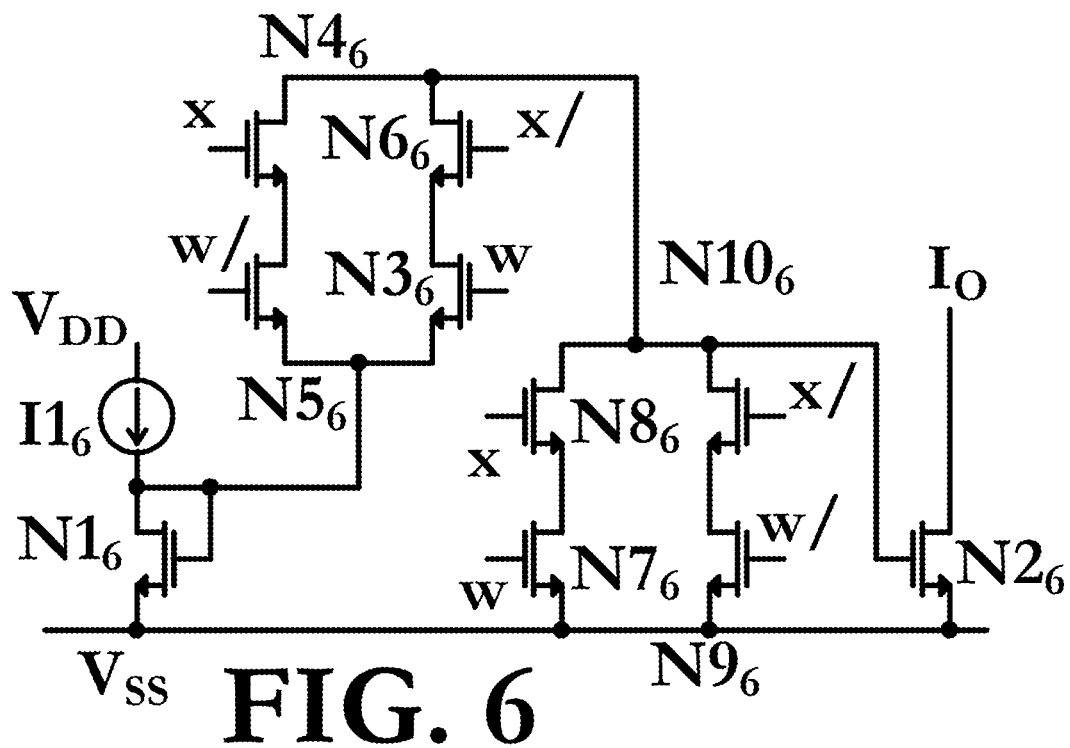
FIG. 6 is a simplified circuit schematic of an embodiment illustrating another pair of series-parallel composite transistor ($iSW_{SP}$) combined with a MOS current source, wherein a common analog input of each of the $iSW_{SP}$s are coupled with the gate port of the MOS current source, and wherein each of the $iSW_{SP}$s comprises four transistors that function as both as an analog switch pair as well as an XOR (all in one $iSW_{SP}$).

Section 6—Description of FIG. 6

FIG. 6 is a simplified circuit schematic of an embodiment illustrating another pair of series-parallel composite transistor (iSW$_{SP}$) combined with a MOS current source, wherein a common analog input of each of the iSW$_{SP}$s in the pair are coupled with the gate port of the MOS current source. Each of the iSW$_{SP}$ comprises four transistors that function as both as an analog switch pair as well as an XOR (all in one iSW$_{SP}$) to effectively arrange an analog-output current mode XOR (iXOR).

The disclosed iXNOR of FIG. 5 and iXOR of FIG. 6 are similar but for the polarity of x, w digital bits that are applied to the respective digital port of the iSW$_{SP}$.

Like prior sections, utilizing the embodiment illustrated in FIG. 6 in MAC in BNNs can be arranged to receive plurality of x, w digital bits inputted to plurality of iXOR to generate plurality of $I_O$ currents that can be summed together to generate an $I_{SO}$ (i.e., utilizing current mode summation for bitwise counting of plurality of logic state '1' of plurality of iXOR outputs for MAC in BNNs).

Figures 7, 8:
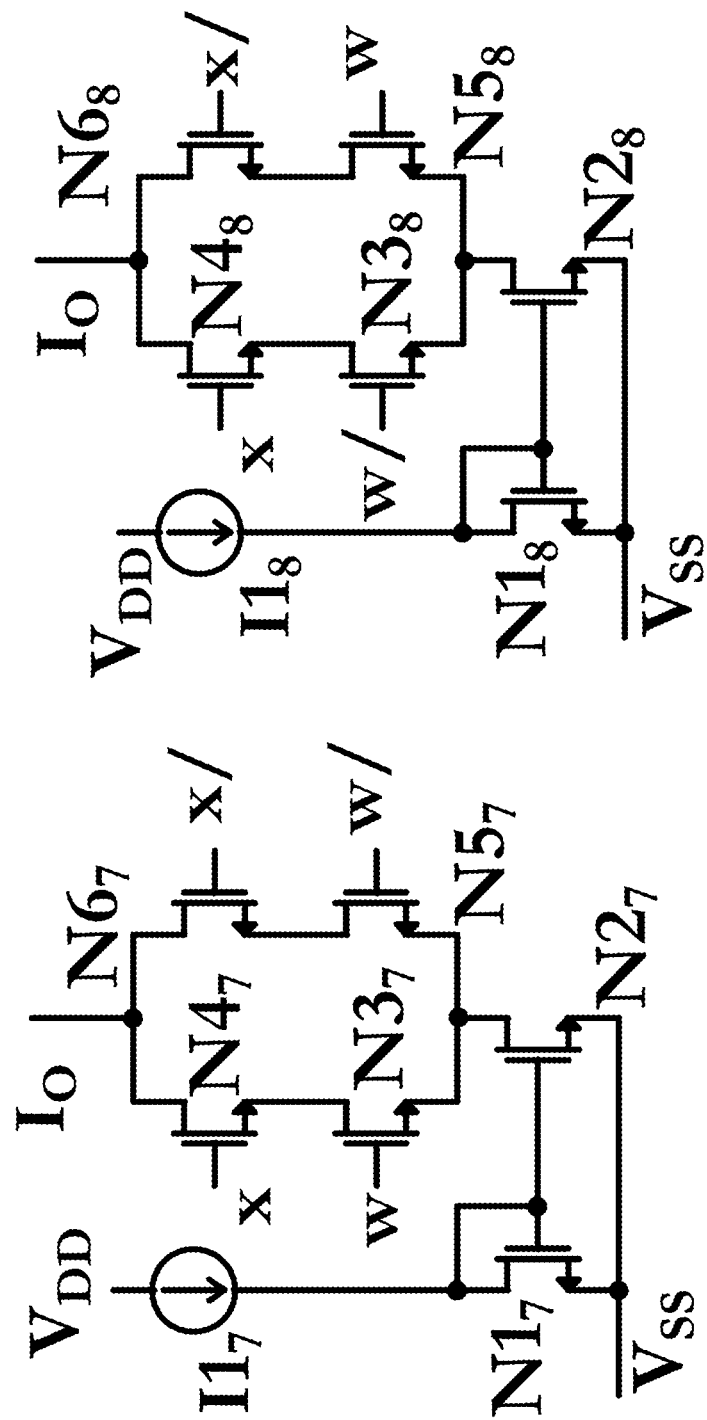
FIG. 7 is a simplified circuit schematic of an embodiment illustrating another series-parallel composite transistor ($iSW_{SP}$) combined with a MOS current source, wherein $iSW_{SP}$ is coupled with the drain port of the MOS current source, and wherein the $iSW_{SP}$ comprises four transistors that function as both as an analog switch as well as an XNOR (all in one $iSW_{SP}$).
FIG. 8 is a simplified circuit schematic of an embodiment illustrating another series-parallel composite transistor ($iSW_{SP}$) combined with a MOS current source, wherein $iSW_{SP}$ is coupled with the drain port of the MOS current source, and wherein the $iSW_{SP}$ comprises four transistors that function as both as an analog switch as well as an XOR (all in one $iSW_{SP}$).

Section 7—Description of FIG. 7

FIG. 7 is a simplified circuit schematic of an embodiment illustrating another series-parallel composite transistor (iSW$_{SP}$) combined with a MOS current source, wherein iSW$_{SP}$ is coupled with the drain port of the MOS current source, and wherein the iSW$_{SP}$ comprises four transistors that function as both as an analog switch as well as an XNOR (all in one iSW$_{SP}$).

Analog switches arranged by N5$_7$ in series with N6$_7$ are controlled by $\bar{x}$ and $\bar{w}$ digital signals, respectively. Also, analog switches are arranged by placing N3$_7$ in series with N4$_7$ that are controlled by x and w digital signals, respectively.

Similar to the functional operation of a digital XNOR, when x and w are both HIGH (logic 1), then the series analog switches N3$_7$ and N4$_7$ are both ON which enables N1$_7$ to scale and mirror its current I1$_7$ onto drain port of N2$_7$ (and through iSW$_{SP}$) to generate $I_O$. Similarly, when digital bits x and w are both LOW (logic 0), then the series analog switches N5$_7$ and N6$_7$ are both ON which again enables N1$_7$ to scale and mirror its current I1$_7$ onto drain port of N2$_7$ (and through iSW$_{SP}$) to generate $I_O$.

As noted in the previous sections, utilizing the embodiment illustrated in FIG. 7 in MAC in BNNs can be arranged to receive plurality of x, w digital bits inputted to plurality of iXNOR to generate plurality of $I_O$ currents that can be summed together to generate an $I_{SO}$ cost effectively (i.e., utilizing current mode summation for bitwise counting of plurality of logic state '1' of plurality of iXNOR outputs for MAC in BNNs).

Section 8—Description of FIG. 8

FIG. 8 is a simplified circuit schematic of an embodiment illustrating another series-parallel composite transistor (iSW$_{SP}$) combined with a MOS current source, wherein iSW$_{SP}$ is coupled with the drain port of the MOS current source, and wherein the iSW$_{SP}$ comprises four transistors that function as both as an analog switch as well as an XOR (all in one iSW$_{SP}$).

The disclosed iXNOR of FIG. 7 and iXOR of FIG. 8 are similar but for the polarity of x, w digital bits that are applied to the respective digital ports of the iSW$_{SP}$.

Like prior sections, utilizing the embodiment illustrated in FIG. 8 in MAC in BNNs can be arranged to receive plurality of x, w digital bits inputted to plurality of iXOR to generate plurality of $I_O$ currents that can be summed together to generate an $I_{SO}$ cost effectively (i.e., utilizing current mode summation for bitwise counting of plurality of logic state '1' of plurality of iXOR outputs for MAC in BNNs).

Figure 9:
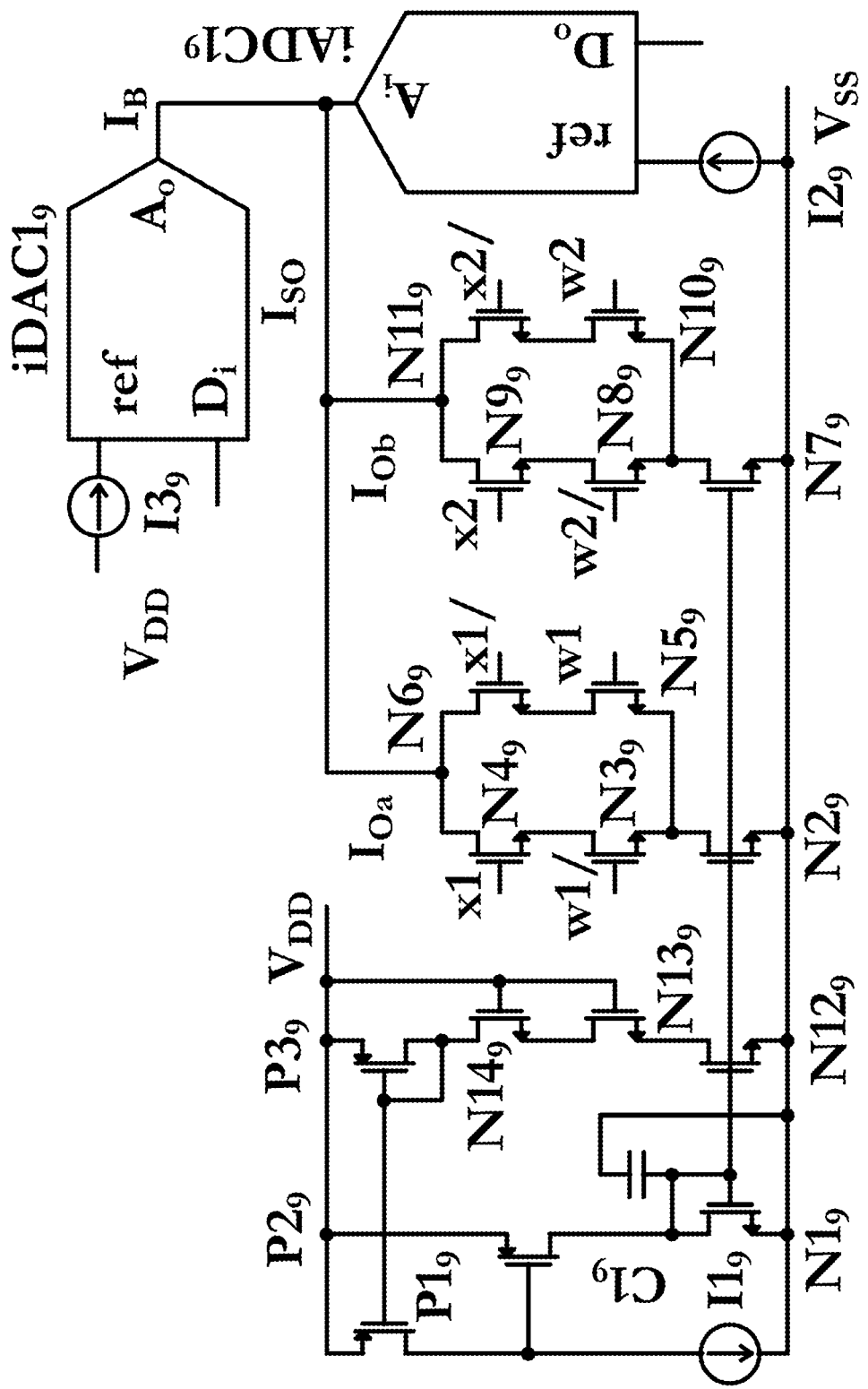
FIG. 9 is a simplified circuit schematic of an embodiment illustrating a single-ended current-mode multiply-accumulate (iMAC) for binarized neural networks (BNN). It comprises a power supply desensitization (PSR) circuit that regulates an $I_{PSR}$ current supplied onto a plurality (e.g., pair) of circuits similar to that of FIG. 8. Single-ended output currents of plurality of digital input XOR to analog output currents are accumulated ($I_{SO}$) and added to a single bias current $I_B$ (generated by a Bias iDAC). An iADC digitalizes the net $I_{SO}+I_B$.

Section 9—Description of FIG. 9

FIG. 9 is a simplified circuit schematic of an embodiment illustrating a single-ended current-mode multiply-accumulate (iMAC) for binarized neural networks (BNN). It comprises a power supply desensitization (PSR) circuit that regulates an $I_{PSR}$ current supplied onto a plurality (e.g., pair) of circuits similar to that of FIG. 8.

Single-ended output currents of plurality of digital input XOR to analog output currents are accumulated ($I_{SO}$) and added to a single bias current $I_B$ generated by a Bias iDAC. A single-ended input current iADC digitalizes the net $I_{SO}+I_B$.

The embodiment disclosed in FIG. 9 utilizes plurality (e.g., a pair) of iXORs whose currents (i.e., supplied by N7$_9$ and N2$_9$) are mirrored from the PSR circuit comprising of P1$_9$ through P3$_9$, plus N12$_9$ through N14$_9$ as well as N1$_9$.

The PSR circuit of FIG. 9 operates as follows: As the $V_{DD}$ varies, P2$_9$ regulates the currents through N1$_9$-N12$_9$ current mirror in order for P1$_9$ and P3$_9$ currents to be equalized. Since current through P1$_9$ is substantially equal to I1$_9$ (which is arranged as a constant current reference), then the operating current of diode connected P3$_9$ is regulated by the PSR circuit to follow the constant current reference I1$_9$.

Be mindful that the DC voltage of the summing node, where the summation current $I_{SO}+I_B$ flow through, can be arranged to be (an equivalent of a diode connected) $V_{GS}$ of a PMOSFET that can be arranged to track the diode connected $V_{GS}$ of P3$_9$.

Accordingly, the single-ended sum of $I_{SO}+I_B$ currents flowing through the equivalent of a diode connected $V_{GS}$ of a PMOSFET as the input of a single-ended current mode ADC (iADC) or a single-ended current mode comparator (iCOMP) can be regulated by the PSR circuit to follow the constant current reference proportional to I1$_9$.

Thus, the disclosed embodiments provides the option of desensitization $I_{SO}$, $I_B$ currents from power supply variations with a single transistor current source (e.g., N2$_9$ and N7$_9$) instead of a cascoded current source, which can save substantial die area considering the plurality (e.g., 1000s) of iXORs may be required for a typical MAC in BNNs.

It can be noticed that in FIG. 9 the single-ended $I_{SO}$ (e.g., the sum of the plurality of iXOR analog-output currents) is added to a single-ended $I_B$ bias current supplied by a single ended Bias iDAC1$_9$ and then $I_{SO}+I_B$ is digitized by a single-ended iADC1$_9$. Also, keep in mind that in iMAC for BNNs, instead of utilizing an iADC1$_9$ a current mode comparator (iCMOP) can be utilized to generate a digital signal indicative of the sign of $I_{SO}+I_B$.

Utilizing the disclosed embodiment illustrated in FIG. 9 in MAC in BNNs can be arranged to receive plurality of x, w digital bits inputted to plurality of iXOR to generate plurality of single-ended $I_O$ currents that can be added to single-ended $I_B$ of a Bias iDAC current to generate a single-ended $I_B+I_{SO}$ which can be digitized by a single-ended iADC or an iCMOP cost effectively (i.e., utilizing current mode summation for bitwise counting of plurality of logic state '1' of plurality of iXOR outputs for MAC in BNNs).

Keep in mind that the disclosed embodiment illustrated in FIG. 9 can be utilized for Compute-In-Memory (CIM) wherein the plurality of single-ended iXORs can be placed on chip right next to memory (e.g., register, latch SRAM, EPROM, E²PROM, etc). As such, the plurality of weights (i.e., the array of digital bits $w_i$) can be pre-loaded onto and next to the single-ended iXOR which lowers the dynamic power consumption associated with read/write cycles of digital weight signals.

Figure 10:
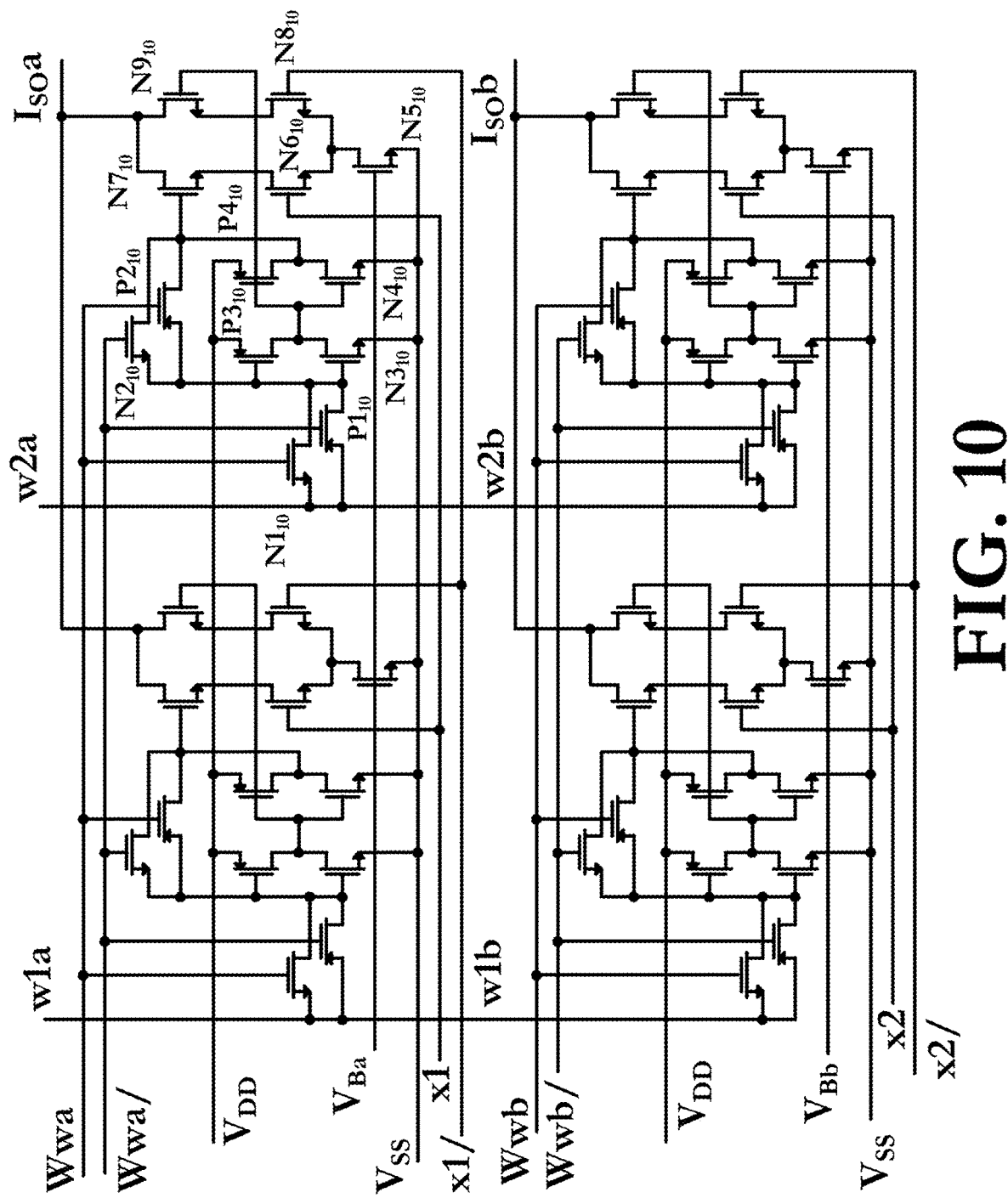
FIG. 10 is a simplified circuit schematic of an embodiment illustrating an iMAC for BNN arranged with Compute-In-Memory (CIM). Plurality of circuits of FIG. 7 comprising digital input XNOR to analog output currents are arranged in a latch memory register array to perform CIM. Plurality of digital weights ($w_i$) are stored on the latch array, while sequence of $x_i$ digital signals can be inputted for iMAC operations in BNN wherein plurality of rows (e.g., rows a and b) of sums of analog-output currents (e.g., $I_{SO}$a and $I_{SO}a$) represent the analog equivalent of the digital sum of the plurality of respective $\overline{x_i \oplus w_i}$.

Section 10—Description of FIG. 10

FIG. 10 is a simplified circuit schematic of an embodiment illustrating an iMAC for BNN with Compute-In-Memory (CIM). Plurality of circuits similar to that of FIG. 7 comprising digital input XNOR to analog output currents (e.g., plurality of iXNORs) are arranged in a Latch memory register array to perform CIM. Plurality of digital weights ($w_i$) are stored on the Latch memory array, while $x_i$ digital signals can be inputted for iMAC operations in BNN wherein plurality of rows (e.g., rows a and b) of sums of analog-output currents (e.g., $I_{SO}a$ and $I_{SO}a$) represent the analog equivalent of the digital sum of the plurality of respective $\overline{x_i \oplus w_i}$.

FIG. 10 depicts four iXNORs with a 2×2 matrix array of (four) latches in a CIM arrangement for illustrative clarity, but a latch array in a typical CIM in MAC for BNNs can be significantly larger (e.g., an array including 1000s of latches). Each of the four iXNORs plus each of the four latch cells are depicted as identical to other ones here.

Each latch cell that is inputted with the digital weight signals (w) and digital row select weight write signals (e.g., row 'a' digital write signals Wwa & $\overline{Wwa}$) is comprised on 8 transistors including cascade of 2 inverters (e.g., $N3_{10}$–$P3_{10}$ and $N4_{10}$–$P4_{10}$), an input switch (e.g., $N1_{10}$–$P1_{10}$) plus a feedback switch (e.g., $N2_{10}$–$P2_{10}$).

To lower dynamic power consumption associated with reading/writing digital weight data in-and-out of memory, the weight data can be stored in a respective latch, wherein each respective latch cell on the silicon die is not only laid-out right next to its respective iXNOR cell but also the training data-set is pre-loaded and latched onto the respective iXNOR (e.g., $N5_{10}$ through $N9_{10}$) such as the one described and illustrated in section 7 and FIG. 7.

Training data-set is loaded onto respective array of latch cells one row at a time via write control signals (e.g., Wwa & $\overline{Wwa}$) which control the row of latch array input switches (e.g., $N1_{10}$–$P1_{10}$). Once the said digital weights data-set (e.g., $w_{1a}$, $w_{2a}$) are loaded, the latch array input switches of the selected row (e.g., 'a') are turned off to isolate the said latch cell from the weight data-set bus, and concurrently the row's latch array feedback switches (e.g., $N2_{10}$–$P2_{10}$) lock the weight data into the respective latch array.

Accordingly, the respective digital outputs of the latch array (laid-out on the silicon die right next to their respective iXNOR array) receive their respective digital weight data-set (e.g., $w_{1a}$, $w_{2a}$) into the respective weight digital ports of iXNOR arrays (e.g., gate ports of $N7_{10}$, $N9_{10}$).

The signal data-set (e.g., x1 & $\overline{x1}$) can be loaded onto a selected row of the respective iXNOR signal input port (e.g., gate ports of $N6_{10}$, $N8_{10}$).

The outputs of plurality of iXNORs (along a latch array row or a latch array column, depending on the system architecture and software specifications) can be coupled together to generate plurality of summation currents (e.g., $I_{SOa}$, $I_{SOb}$).

As such, utilizing the embodiment illustrated in FIG. 10 in MAC in BNNs with Compute-In-Memory (CIM) can be arranged to receive plurality of x, w digital bits (wherein training weight data-set 'w' are stored in a latch array and) inputted to a plurality of iXNOR to generate a plurality of $I_O$ currents that can be summed together to generate an $I_{SO}$ (i.e., utilizing current mode summation for bitwise counting of plurality of logic state '1' of plurality of iXNOR outputs for MAC in BNNs).

Section 11—Description of FIG. 11

FIG. 11 is a simplified circuit schematic of an embodiment illustrating a single-ended iMAC for BNN with CIM, utilizing SRAMs.

The embodiment disclosed in FIG. 11 is similar to that of the FIG. 10 embodiment with the difference being that a 6 transistor SRAM array is utilized instead of a Latch array.

Plurality of circuits similar to that of FIG. 7 equip plurality of mixed-mode single-ended iXNORs to be arranged in a SRAM memory array with CIM.

The digital weight ($w_i$) data-set is stored in the SRAM array while the respective $x_i$ digital signals are inputted to the iMAC in BNNs.

Consequently, a plurality of rows (e.g., rows a and b) of single-ended sums of analog-output currents (e.g., $I_{SO}a$ and $I_{SO}b$) are generated that represent the analog equivalent of the digital sum of the plurality of respective $\overline{x_i \oplus w_i}$ function.

FIG. 11 depicts four iXNORs with a 2×2 matrix array of (four) SRAM cells in a CIM arrangement for illustrative clarity, but an SRAM array in a typical CIM in MAC for BNNs can be significantly larger (e.g., an array including 1000s of SRAMs). Each of the four iXNORs plus each of the four SRAM cells are depicted as identical to other ones in this illustration.

Each SRAM cell that is inputted with the digital weight signals (e.g., w1a & $\overline{w1a}$) and digital row select weight write signals (e.g., row 'a' digital write signals Wwa) is comprised on 6 transistors including cascade of 2 input-to-output inverters (e.g., $P1_{11}$–$P2_{11}$ and $N3_{11}$–$N4_{11}$), and an input pass switch (e.g., $N1_{11}$–$N2_{11}$).

To lower dynamic power consumption associated with reading/writing digital weight data in-and-out of memory, the weight data can be stored in its respective SRAM cell, wherein each respective SRAM cell on the silicon die is not only laid-out right next to its respective iXNOR cell but also the training data-set is locked onto the respective iXNOR (e.g., $N5_{11}$ through $N9_{11}$) similar to the one described in section 7 FIG. 7.

Training data-set is loaded onto respective array of SRAM cells one row at a time via write control signal (e.g., Wwa) which control the row of SRAM array input switches (e.g., $N1_{11}$–$N2_{11}$). Once the said digital weights data-set (e.g., w1a & $\overline{w1a}$ and w2a & $\overline{w2a}$) are loaded, the SRAM array input switches for the selected row (e.g., 'a') are turned off wherein the row's SRAM array feedback (2 input-to-output inverters) locks the weight data into the respective cells of the SRAM array. Here, the respective digital weight data-set (e.g., w1a & $\overline{w1a}$ and w2a & $\overline{w2a}$) are received by the respective weight digital ports of iXNOR arrays (e.g., gate ports of $N6_{11}$, $N8_{11}$).

The signal data-set (e.g., x1 & $\overline{x1}$) can be loaded onto a selected row of the respective iXNOR signal input port (e.g., gate ports of $N7_{11}$, $N9_{11}$).

Accordingly, the outputs of plurality of iXNORs (along a SRAM array row or a SRAM array column, depending on the system and software requirements) can be coupled together to generate plurality of summation currents (e.g., $I_{SOa}$, $I_{SOb}$).

In summary, utilizing the embodiment illustrated in FIG. 11 in MAC in BNNs with Compute-In-Memory (CIM) can be arranged to receive plurality of x, w digital bits (wherein training weight data-set 'w' are stored in an SRAM array and) inputted to plurality of iXNOR to generate plurality of $I_O$ currents that can be summed together to generate an $I_{SO}$ (i.e., utilizing current mode summation for bitwise counting of plurality of logic state '1' of plurality of iXNOR outputs for MAC in BNNs).

Section 12—Description of FIG. 12

FIG. 12 is a simplified circuit schematic of an embodiment illustrating a differential iMAC for a BNN. It comprises a power supply desensitization (PSR) circuit that regulates an $I_{PSR}$ current supplied onto a plurality (e.g., pair) of digital-input analog-out current XOR (iXOR) similar to that of the circuit in FIG. 13.

Here, differential output currents of plurality of analog output currents of plurality of iXOR are accumulated differentially ($dI_{SO}=I_{SO1}-I_{SO2}$) and added to a differential bias current $dI_B$, wherein $dI_B$ is generated by a differential Bias iDAC. A differential current-input comparator (diCOM) generates the sign of the net result of $dI_{SO}+dI_B$.

The embodiment disclosed in FIG. 12 utilizes plurality (e.g., a pair) of iXORs whose currents (e.g., supplied by $N5_{12}$) are mirrored from the PSR circuit comprising of $P1_{12}$ through $P3_{12}$, plus $N1_{12}$ through $N4_{12}$ as well as $I1_{12}$.

The PSR section of the circuit of FIG. 12 operates as follows: As the $V_{DD}$ varies, the $P3_{12}$ regulates the currents through $N1_{12}$-$N2_{12}$ current mirror in order for $P1_{12}$ and $P2_{12}$ currents to be equalized. Since the current through $P1_{12}$ is substantially equal to $I1_{12}$, which is arranged as a constant current reference, then operating current of diode connected $P2_{12}$ is regulated by the PSR circuit to follow the constant current reference $I1_{12}$.

Be mindful that the DC voltage of the summing node, where the summation differential current $dI_{SO}+dI_B$ flow through, can be arranged to be (as an equivalent of a diode connected pair of) $V_{GS}$ of a PMOSFET that can be arranged to track the (diode connected) $V_{GS}$ of $P3_9$. Accordingly, the differential sum of $I_{SO}+I_D$ currents flowing through the equivalent of a pair of diode connected $V_{GS}$ of a PMOSFET (as the differential input of a current mode ADC or current mode comparator $diCOMP_{12}$) can be regulated by the PSR circuit to follow the constant current reference proportional to $I1_{12}$. The disclosed embodiments provides the option of desensitization of $I_{SO}$ and $I_B$ currents from power supply variations with a single transistor current source (e.g., $N5_{12}$) per each iXOR instead of a cascoded current source, which can save substantial die area considering the plurality (e.g., 1000s) of iXORs may be required for a typical MAC in BNNs.

It can be noticed that in FIG. 12 the differential $I_{SO}$ (e.g., the sum of the plurality of iXOR differential analog-output currents) are added to a differential $dI_B$ bias current supplied by a differential Bias $iDAC1_{12}$ and then the polarity of the $dI_{SO}+dI_B$ differential sum is digitized by a differential $diComp_{12}$.

As an example, the mixed-mode differential iXOR of FIG. 12 operates as follows (letting $I_1$ substantially equal the drain current of $N5_{12}$):

When $w_1=0$, then $I_1$ flows through $N6_{12}$ (while $N7_{12}$ is starved which cuts off any operating current from flowing through both $N10_{12}$ and $N11_{12}$). With $w_1=0$, If $x_1=0$, then $I_1$ that flows through $N6_{12}$ is passed on to flow through $N8_{12}$ and onto positive port of diCOMP. Also, with $w_1=0$, if $x_1=1$, then $I_1$ that flows through $N6_{12}$ is passed on to flow through $N9_{12}$ and onto the negative port of diCOMP.

When $w_1=1$, then $I_1$ flows through $N7_{12}$ (while $N6_{12}$ is starved which cuts off both $N8_{12}$ and $N9_{12}$). With $w_1=1$, If $x_1=0$, then $I_1$ that flows through $N7_{12}$ is passed on to flow through $N11_{12}$ and onto negative port of diCOMP. Also, with $w_1=1$, if $x_1=1$, then $I_1$ that flows through $N7_{12}$ is passed on to flow through $N10_{12}$ and onto the positive port of diCOMP.

In summary, utilizing the disclosed embodiment illustrated in FIG. 12 in MAC in BNNs can be arranged to receive plurality of x, w digital bits inputted to plurality of iXOR to generate plurality of differential $dI_O$ currents that can be added to differential $dI_B$ of a Bias iDAC current to generate a differential $dI_B+dI_{SO}$ which can be digitized by a differential iADC or a differential iCMOP (i.e., utilizing differential current mode summation for bitwise counting of plurality of logic state '1' of plurality of iXOR outputs for MAC in BNNs).

Keep in mind that the disclosed embodiment illustrated in FIG. 12 can be utilized for Compute-In-Memory (CIM) wherein the plurality of differential iXORs can be placed on chip right next to memory (e.g., register, latch SRAM, EPROM, $E^2$PROM, etc). As such, a plurality of weights (i.e., the array of digital bits $w_i$) can be stored and loaded onto the iXOR which lowers the dynamic power consumption associated with read/write cycles of digital weight signals.

Section 13—Description of FIG. 13

FIG. 13 is a simplified circuit schematic of a differential analog output current XNOR and or XOR. The differential analog output currents are generated via a differential pair (biased by a MOS current source), wherein the outputs of the differential pair are each coupled with the common source ports of another differential pair.

The mixed-mode differential iXOR of FIG. 13 operates as follows (letting $I_1$ substantially equal the drain current of $N2_{13}$):

When $w=0$, then $I_1$ flows through $N3_{13}$ parallel pair, while $N4_{13}$ is starved which cuts off both $N7_{13}$ and $N8_{13}$ from current. With $w=0$, if $x=0$, then $I_1$ is passed on to flow through $N5_{13}$ and onto $I_{O2}$ current port. Also, with $w=0$, if $x=1$, then $I_1$ flows through $N6_{13}$ and onto $I_{O1}$ current port.

When $w=1$, then $I_1$ flows through $N4_{13}$ parallel pair, while $N3_{13}$ is starved which cuts off both $N5_{13}$ and $N6_{13}$ from current. With $w=1$, if $x=0$, then $I_1$ is passed on to flow through $N7_{13}$ and onto $I_{O1}$ current port. Also, with $w=1$, if $x=1$, then $I_1$ flows through $N8_{13}$ and onto $I_{O2}$ current port.

As discussed in section 12 and illustrated in FIG. 12, the circuit of FIG. 13 can be utilized in the disclosed embodiments similar to that of FIGS. 10, 11, and 14 in Compute-In-Memory (CIM) arrangements wherein the plurality of differential iXORs can be placed on chip right next to memory (e.g., register, latch SRAM, EPROM, $E^2$ PROM, etc). As such, the plurality of weights (i.e., the array of digital bits $w_i$) can be pre-stored/pre-loaded onto the differential iXOR which lowers the dynamic power consumption associated with read/write cycles of digital weight signals.

Section 14—Description of FIG. 14

FIG. 14 is a simplified circuit schematic of an embodiment illustrating a differential iMAC for BNN with CIM, wherein the CIM utilizes SRAMs. The embodiment disclosed in FIG. 14 is similar to that of FIG. 11, but for an array of differential iXOR (similar to the circuit depicted in FIG. 13) that is utilized instead of a single-ended iXOR array (utilized in FIG. 11).

Plurality of mixed-mode differential iXNORs or iXORs (with digital input to differential analog output currents) can be utilized here in a SRAM memory array with CIM. The digital data that is stored in the SRAM array such as weights ($w_i$) along with array of respective $x_i$ digital signals are inputted to the differential iMAC for BNN. As a result, plurality of rows (e.g., rows a and b) of differential sums of analog-output differential currents (e.g., $dI_{SO}a=I_{SO1}a-I_{SO2}a$ and $dI_{SO}b=I_{SO1}b-I_{SO2}b$) are generated that represent the analog equivalent of the digital sum of the plurality of respective $x_i \oplus w_i$ and or $\overline{x_i \oplus w_i}$ (depending on choosing $I_{SO1}$ or $I_{SO2}$ as the positive or negative output current).

FIG. 14 depicts four differential iXNORs or iXORs with a 2×2 matrix array of (four) SRAM cells in a CIM arrangement for illustrative clarity, but an SRAM array in a typical CIM in MAC for BNNs can be significantly larger (e.g., an array including 1000s of SRAMs). Each of the four differential iXNORs or iXORs plus each of the four SRAM cells are depicted as identical to other ones.

Each SRAM cell that is inputted with the digital weight signals (e.g., w1a & $\overline{w1a}$) and digital row select weight write signals (e.g., row 'a' digital write signals Wwa) is comprised on 6 transistors including cascade of 2 input-to-output inverters (e.g., $P1_{14}$–$P2_{14}$ and $N3_{14}$–$N4_{14}$), and an input pass switch (e.g., $N1_{14}$–$N2_{14}$).

To lower dynamic power consumption associated with reading/writing digital weight data in-and-out of memory, the weight data can be stored in its respective SRAM, wherein each respective SRAM cell on the silicon die is not only laid-out right next to its respective differential iXNOR or iXOR cell but also the training data-set is pre-loaded and locked onto the respective differential iXNOR or iXOR (e.g., $N9_{14}$ through $N11_{14}$).

Training data-set is loaded onto respective array of SRAM cells one row at a time via write control signal (e.g., Wwa) which control the row of SRAM array input switches (e.g., $N1_{14}$-$N2_{14}$). Once the said digital weights data-set (e.g., w1a & $\overline{w1a}$ and w2a & $\overline{w2a}$) are loaded, the SRAM array input switches of the selected row (e.g., 'a') are turned off wherein the row's SRAM array feedback (2 input-to-output inverters) locks the weight data into the respective cells of the SRAM array. Here, the respective digital outputs of the SRAM array receive their respective digital weight data-set (e.g., w1a & $\overline{w1a}$ and w2a & $\overline{w2a}$) and supply them into the respective weight digital ports of differential iXNOR or iXOR arrays (e.g., $N9_{14}$ through $N11_{14}$).

The signal data-set (e.g., x1 & $\overline{x1}$) can be loaded onto a selected row of the respective differential iXNOR or iXOR signal input port (e.g., gate ports of $N6_{14}$, $N7_{14}$).

The outputs of plurality of differential iXNORs or iXOR (along a SRAM array row or a SRAM array column, depending on the system and software requirements) can be coupled together to generate plurality of summation currents (e.g., $I_{SOa}$, $I_{SOb}$).

As such, utilizing the embodiment illustrated in FIG. 14 in MAC in BNNs with Compute-In-Memory (CIM) can be arranged to receive plurality of x, w digital bits (wherein training weight data-set 'w' are stored and) inputted to plurality of differential iXNOR or iXOR to generate plurality of $I_O$ currents that can be summed together to generate an $I_{SO}$ (i.e., utilizing current mode summation for bitwise counting of plurality of logic state '1' of plurality of iXNOR or iXOR outputs for MAC in BNNs).

What is claimed:

1. A method of performing a multiply-accumulate operation for binarized neural networks in an integrated circuit, the method comprising:
   supplying a regulated current source ($I_{PSR}$) having a value of $I_{PSRv}$, mirroring and scaling $I_{PSR}$ onto a plurality of current sources ($I_S$), each having a value $I_{Sv}$ that is proportional to $I_{PSRv}$;
   individually gating each $I_S$ in the plurality of $I_S$ current sources, each gating responsive to a logical combination of one of an XOR, and an XNOR of a corresponding pair of digital input signals (x, w) to generate a plurality of corresponding analog-output current sources ($I_o$), wherein each of the $I_o$ current sources has a value that swings between substantially zero and substantially $I_{Sv}$ responsive to the logical combination of the one of the XOR, and the XNOR of the corresponding pair of digital input signals x, w;
   combining the plurality of $I_o$ current sources to generate an analog summation current ($I_{S_{1count}}$), wherein $I_{S_{1count}}$ is a cumulative analog output signal representing a cumulative bitwise count of the logical combination of each of the one of the XOR, and the XNOR of the corresponding pair of digital input signals;
   coupling the $I_{S_{1count}}$ current with at least one of a current input comparator (iCOMP), and a current input Analog-to-Digital-Converter (iADC);
   wherein each of the $I_o$ current sources at least one of a single-ended analog current output, and a differential analog current output ($I_{o1}$, $I_{o2}$);
   wherein the $I_{S_{1count}}$ forms at least one of a single analog current ($I_{SO}$) and a differential analog current pair ($I_{SO1}$, $I_{SO2}$); and
   wherein the at least one of the current input iCOMP, and the current input iADC, each receives at least one of the $I_{SO}$, and the $I_{SO1}$, $I_{SO2}$.

2. The method of performing a multiply-accumulate operation for binarized neural networks in an integrated circuit of claim 1, the method further comprising:
   controlling the individually gating each $I_S$ in the plurality of $I_S$ current sources in a respective analog current switch (iSW).

3. The method of performing a multiply-accumulate operation for binarized neural networks in an integrated circuit of claim 1, the method further comprising:
   controlling the individually gating each $I_S$ in the plurality of $I_S$ current sources via a corresponding analog current switch (iSW) at one of a gate port, a source port, and a drain port of each $I_S$ current source.

4. The method of performing a multiply-accumulate operation for binarized neural networks in an integrated circuit of claim 1, the method further comprising:
   coupling the at least one of the $I_{SO}$ to a single current output of a current mode Bias DAC (iDAC).

5. The method of performing a multiply-accumulate operation for binarized neural networks in an integrated circuit of claim 1, the method further comprising:

coupling the at least one of the $I_{SO1}$, $I_{SO2}$ pair to a differential current output of a current mode Bias DAC (iDAC).

6. The method of performing a multiply-accumulate operation for binarized neural networks in an integrated circuit of claim 1, the method further comprising:

storing at least one of the pair of digital input signals x, w in a digital memory array comprising at least one of a Latch array, a SRAM array, an EPROM array, and an $E^2$PROM array.

7. The method of performing multiply-accumulate for binarized neural networks in integrated circuits of claim 1, the method further comprising:

controlling the individually gating each $I_S$ in the plurality of $I_S$ current sources to generate each corresponding $I_{o1}$ and $I_{o2}$ comprising:

operating a quiescent current source ($I_Q$) through a differential pair comprising a first transistor ($M_1$) and a second transistor ($M_2$), wherein $I_Q$ has a current source value proportional to the $I_S$ current source value, and wherein each transistor comprises a drain-port, a gate-port, and a source-port;

controlling the gate-ports of the $M_1$ and the $M_2$ with a pair of first digital signals (w, $\overline{w}$), wherein currents in drain-ports of the $M_1$ and the $M_2$ are responsive to w, $\overline{w}$;

feeding the drain current of the $M_1$ onto a common source port of a second differential pair, wherein the second differential pair comprises a third transistor ($M_3$) and a fourth transistor ($M_4$), and wherein each transistor comprises a drain-port, a gate-port, and a source-port;

controlling the gate-ports of the $M_3$ and the $M_4$ with a pair of first digital signals (x, $\overline{x}$), wherein currents in the drain-ports of the $M_3$ and the $M_4$ are responsive to x, $\overline{x}$;

feeding the drain current of the $M_2$ onto a common source port of a third differential pair, wherein the third differential pair comprises a fifth transistor ($M_5$) and a sixth transistor ($M_6$), and wherein each transistor comprises a drain-port, a gate-port, and a source-port;

controlling the gate-ports of the $M_5$ and the $M_6$ with $\overline{x}$, x, wherein currents in the drain-ports of the $M_5$ and the $M_6$ are responsive to $\overline{x}$, x;

coupling the drain port of the $M_3$ with at least one of the drain ports of the $M_5$ and the $M_6$ to form the first current analog output $I_{o1}$; and coupling the drain port of the $M_4$ with at least one of the drain ports of the $M_5$ and the $M_6$ to form the second current analog output $I_{o2}$.

8. The method of performing multiply-accumulate for binarized neural networks in an integrated circuit of claim 1, the method further comprising:

controlling the individually gating each $I_S$ in the plurality of $I_S$ current sources to generate each corresponding $I_o$ comprising:

coupling a first and a second transistor in series to arrange a first serialized composite transistor ($iSW_1$), wherein the first and the second transistors each function as an analog switch comprising two analog ports and a digital control port, and wherein the $iSW_1$ functions as a first composite analog switch comprising two analog ports and two digital control ports;

coupling a third and a fourth transistor in series to arrange a second serialized composite transistor ($iSW_2$), wherein the third and the fourth transistors each function as an analog switch comprising two analog ports and a digital control port, and wherein the $iSW_2$ functions as a second composite analog switch comprising two analog ports and two digital control ports;

coupling the two respective analog ports of the $iSW_1$ and the $iSW_2$ to arrange the $iSW_1$ and the $iSW_2$ in parallel forming a series-parallel composite transistor ($iSW_{SP}$) comprising two analog ports and two digital control ports;

controlling the first and the third transistors with at least one pair of digital signals w, $\overline{w}$ and its opposite $\overline{w}$, w;

controlling the second and the fourth transistors with at least one pair of digital signals x, $\overline{x}$ and its opposite $\overline{x}$, x;

combining the $iSW_{SP}$ with at least one of the plurality of $I_S$ current sources to form at least one of the $I_o$.

9. The method of performing multiply-accumulate for binarized neural networks in integrated circuits of claim 1, the method further comprising:

receiving a reference current signal ($I_R$) into an input port of a power supply desensitization (PSR) circuit; and regulating the $I_{PSR}$ current source to track the $I_R$, wherein the $I_{PSR}$ signal is desensitized from power supply variations.

* * * * *